(12) United States Patent
Arizono

(10) Patent No.: US 7,774,727 B2
(45) Date of Patent: Aug. 10, 2010

(54) LAYOUT MAKING EQUIPMENT OF SEMICONDUCTOR INTEGRATED CIRCUIT, METHOD OF MAKING LAYOUT OF SEMICONDUCTOR INTEGRATED CIRCUIT AND PROCESS OF MANUFACTURE OF SEMICONDUCTOR DEVICE

(75) Inventor: Takamichi Arizono, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 518 days.

(21) Appl. No.: 11/755,269

(22) Filed: May 30, 2007

(65) Prior Publication Data
US 2007/0283307 A1  Dec. 6, 2007

(30) Foreign Application Priority Data
May 31, 2006 (JP) ............................. 2006-152606
Apr. 11, 2007 (JP) ............................. 2007-103432

(51) Int. Cl.
*G06F 17/50* (2006.01)
(52) U.S. Cl. ............................................. 716/5; 716/11
(58) Field of Classification Search .................... 716/1, 716/11, 18, 4, 5
See application file for complete search history.

(56) References Cited

U.S. PATENT DOCUMENTS

| | | | | |
|---|---|---|---|---|
| 5,168,342 A | * | 12/1992 | Shibata | 257/210 |
| 6,009,251 A | | 12/1999 | Ho et al. | 716/5 |
| 6,035,111 A | * | 3/2000 | Suzuki et al. | 716/11 |
| 6,425,113 B1 | | 7/2002 | Anderson et al. | 716/5 |
| 6,810,509 B2 | | 10/2004 | Murakami | 716/5 |
| 7,032,199 B2 | | 4/2006 | Chevallier et al. | 716/5 |
| 7,162,674 B2 | * | 1/2007 | Nozuyama | 714/741 |

FOREIGN PATENT DOCUMENTS

JP      3-171648      7/1991

* cited by examiner

*Primary Examiner*—Sun J Lin
(74) *Attorney, Agent, or Firm*—Oblon, Spivak, McClelland, Maier & Neustadt, L.L.P.

(57) ABSTRACT

The layout making equipment of a semiconductor integrated circuit is provided with a logic circuit schematic design section that design a logic circuit diagram, based on a specification data on a circuit, a layout data creation section that creates a layout data, based on the logic circuit diagram, a logic connection verification section that verifies whether or not a data on potentials inputted in nodes of the devices and nodes of connections between the devices extracted from the layout data match a data on the logic circuit diagram, thereby to create the results, a layout data verification section that verifies whether or not the layout data violates a design rule extracted from the specification data on the circuit, based on the data on the potentials inputted in the nodes of the devices and the nodes of the connections between the devices extracted in the logic connection verification section, thereby to create the verification results, and a data output section that outputs the created layout data.

20 Claims, 20 Drawing Sheets

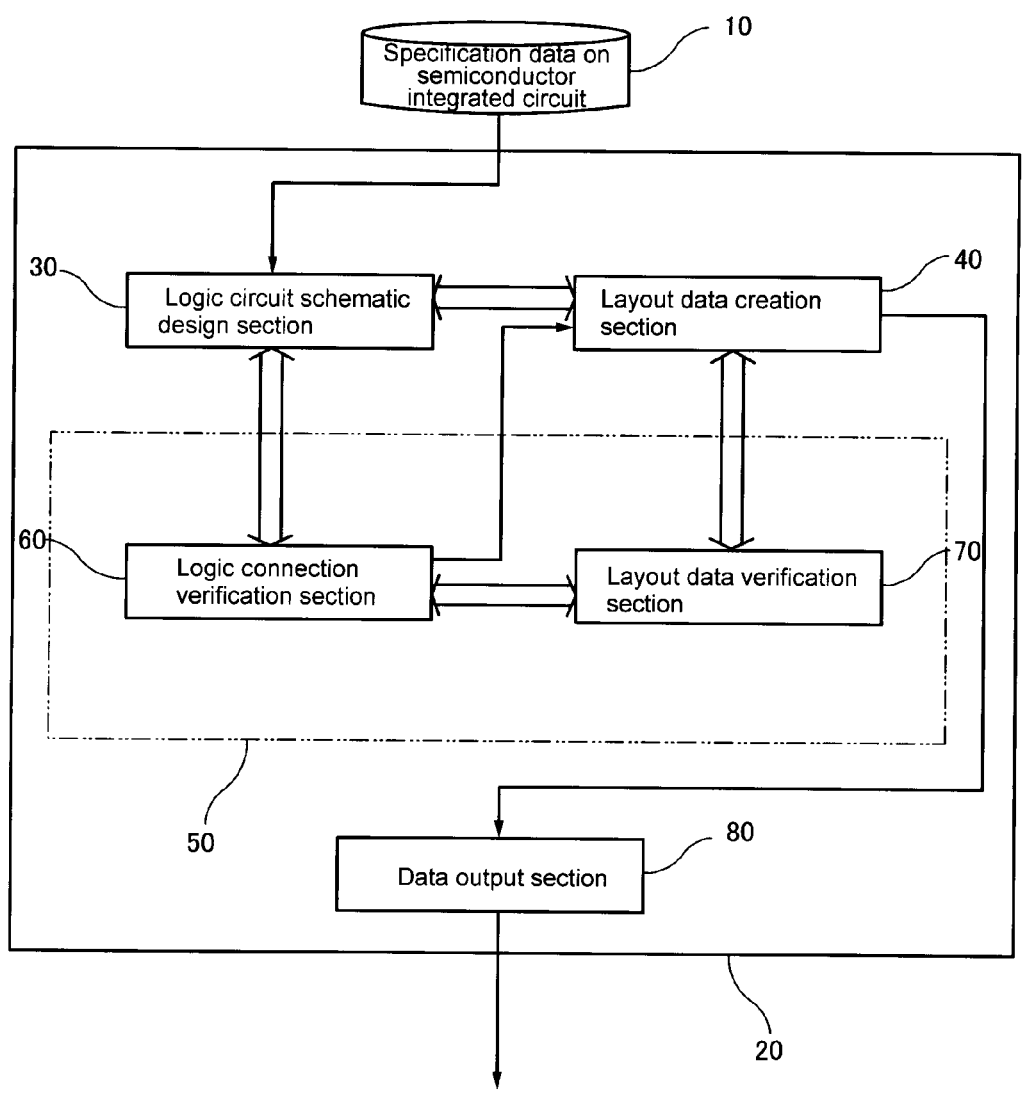

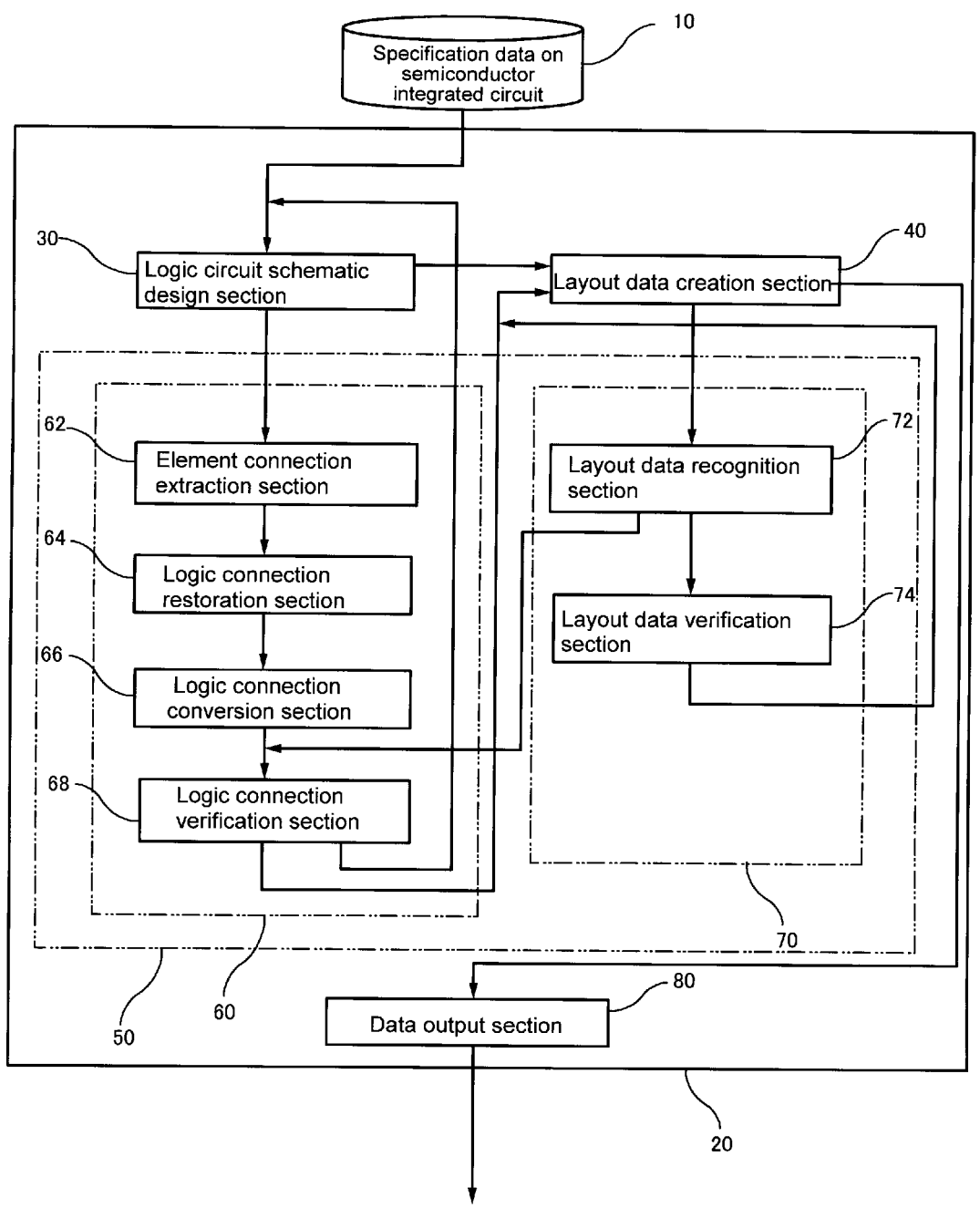

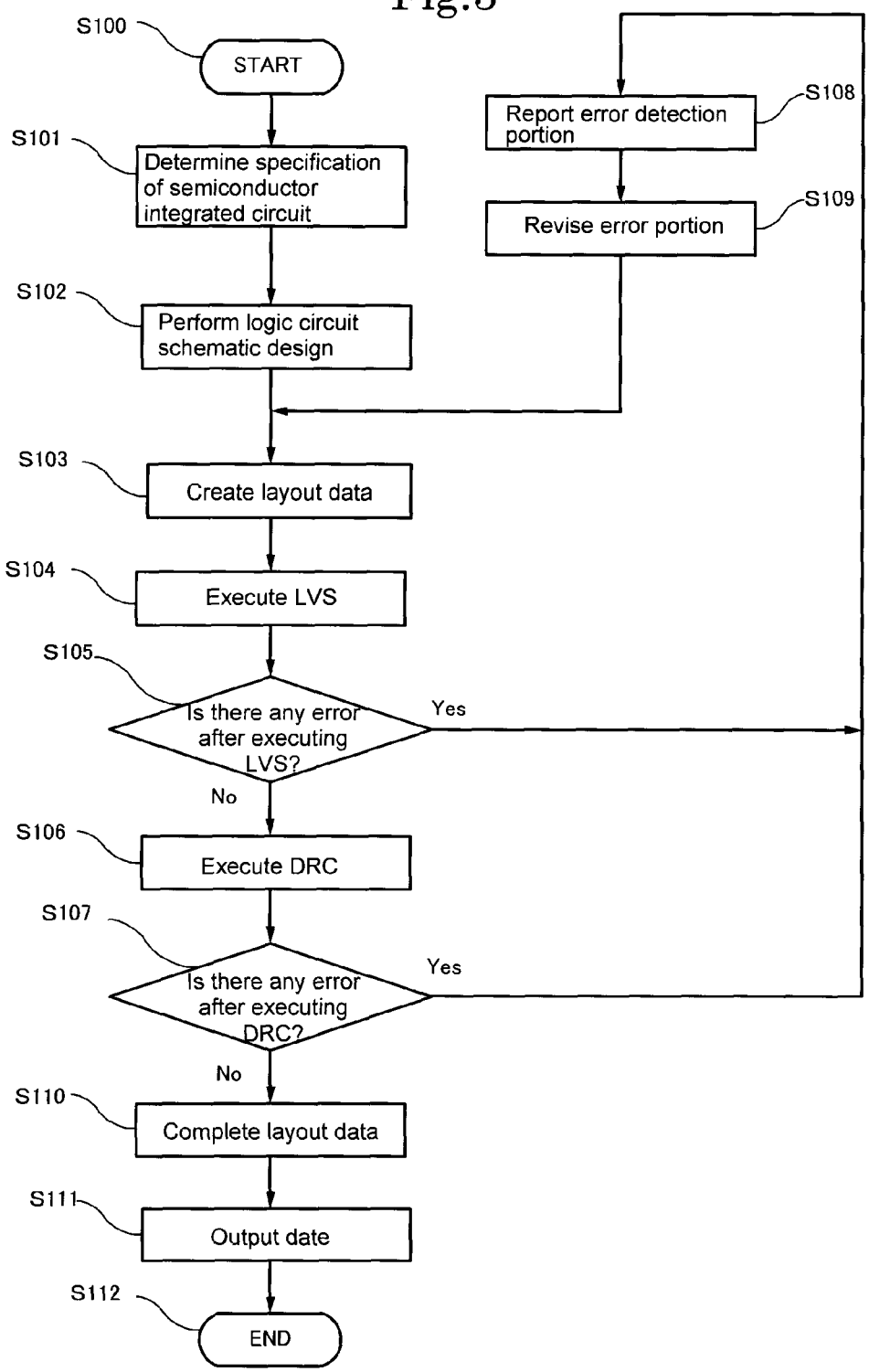

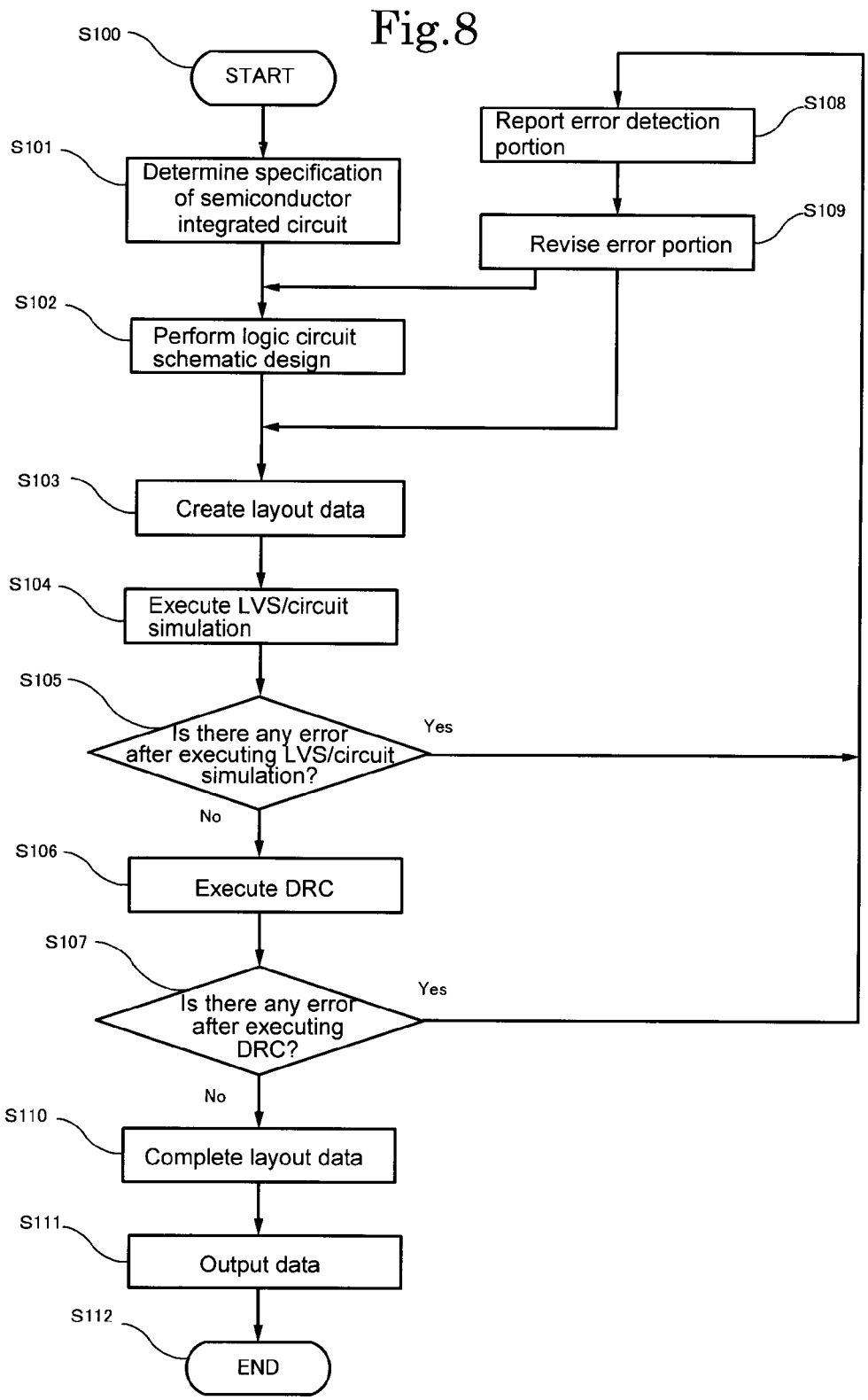

US 7,774,727 B2

LAYOUT MAKING EQUIPMENT OF SEMICONDUCTOR INTEGRATED CIRCUIT, METHOD OF MAKING LAYOUT OF SEMICONDUCTOR INTEGRATED CIRCUIT AND PROCESS OF MANUFACTURE OF SEMICONDUCTOR DEVICE

CROSS-REFERENCE TO RELATED APPLICATIONS

This application is based upon and claims the benefit of priority from the prior Japanese Patent Applications No. 2006-152602 filed on May 31, 2006 and No. 2007-103432 filed on Apr. 11, 2007, the entire contents of which are incorporated herein by reference.

TECHNICAL FIELD

The present invention relates to layout making equipment, a making method, and a process of manufacture of a semiconductor integrated circuit in making a layout of the semiconductor integrated circuit.

BACKGROUND OF THE INVENTION

In the design step of a semiconductor integrated circuit, a logic circuit diagram is designed, based on a specification data on a circuit, and a layout data is created, based on the logic circuit diagram. Whether or not the created layout data is correctly designed in accordance with a design rule originally intended by a designer is verified (hereinafter referred to as "layout check").

The layout check is performed by using Electronic Design Automation (EDA) tools such as Design Rule Checking (DRC) that verifies whether or not the layout violates a geometrical design rule determined from the restriction of manufacturing equipment, Layout Versus Schematic (LVS) that verifies whether or not a data on devices and connections between the devices prepared in a logic circuit schematic design step is correctly realized in the layout data, and Electric Rule Check (ERC) that verifies the electrical connection of a logic circuit diagram. The layout data is completed at a time when any error is not detected in a verification performed by the DRC, LVS or the like (Japanese Patent Application Laid-Open No. 1991-171648).

SUMMARY OF THE INVENTION

The layout making equipment of a semiconductor integrated circuit of one embodiment in the present invention provides a logic circuit schematic design section that designs a logic circuit diagram, based on a specification data on a semiconductor integrated circuit, a layout data creation section that creates a layout data, based on the designed logic circuit diagram, a logic connection verification section that extracts a data on devices and connections between the devices from the created layout data, verifies whether or not the data on the logic circuit diagram matches the data on the extracted devices and the data on the connections between the devices, further extracts a data on potentials inputted in nodes of the devices and nodes of the connections between the devices, based on the data on the logic circuit diagram, and collates and confirms whether or not the data on the potentials matches the data on the logic circuit diagram, thereby to create the results, a layout data verification section that verifies whether or not the created layout data violates a design rule extracted from the specification data on the semiconductor integrated circuit, based on the data on the devices and the connections between the devices and the data on the potentials inputted in the nodes of the devices and the nodes of the connections between the devices extracted in the logic connection verification section, thereby to create the verification results, and a data output section that outputs the layout data created by the layout data creation section.

BRIEF DESCRIPTION OF THE DRAWINGS

FIG. 1 is a block diagram showing a composition example of layout making equipment of a first embodiment in the present invention;

FIG. 2 is a block diagram showing a composition example of layout making equipment of the first embodiment in the present invention;

FIG. 3 is a flowchart showing one example of a method of creating a layout data of the first embodiment in the present invention;

FIG. 8 is a flowchart showing one example of a method of creating a layout data of the second embodiment in the present invention;

DETAILED DESCRIPTION OF THE INVENTION

Figure 4A:
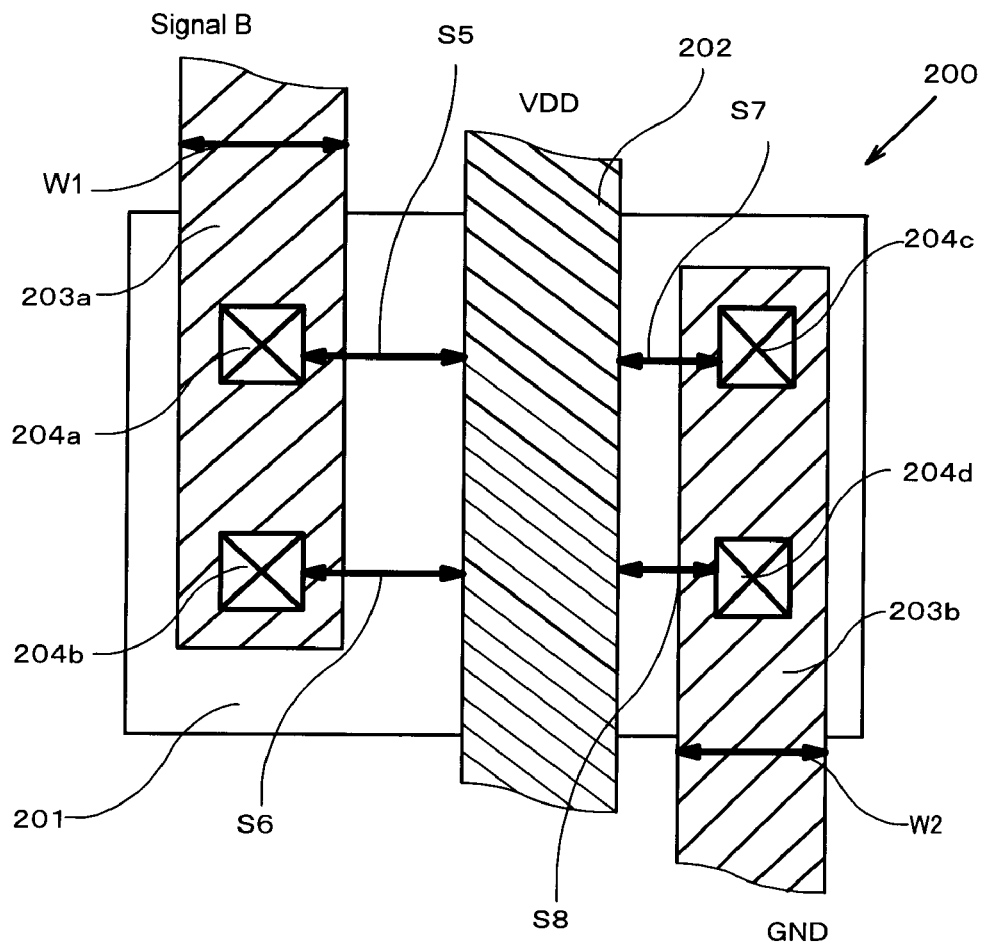
FIG. 4A is a cross-section showing one example of a layout of a MOS transistor that composes a part of a circuit diagram of the first embodiment in the present invention.

The layout making equipment of a semiconductor integrated circuit and the method of creating a layout of one embodiment in the present invention are described in detail below with reference to the drawings. In addition, in the embodiments below-mentioned, the examples of the layout making equipment of a semiconductor integrated circuit and the method of creating a layout of one embodiment in the present invention are shown, and the layout making equipment of a semiconductor integrated circuit and the method of creating a layout of one embodiment in the present invention are not limited to those embodiments only.

First Embodiment

FIG. 1 is a block diagram showing a composition example of the layout making equipment of a semiconductor integrated circuit of the first embodiment in the present invention. The layout data creation equipment 20 of the first embodiment is, as shown in FIG. 1, provided with a logic circuit schematic design section 30 that designs a logic circuit diagram, based on a specification data 10 on a semiconductor integrated circuit, a layout data creation section 40 that creates a layout data, based on a data on the logic circuit diagram designed by the logic circuit schematic design section 30, a layout data verification section 50, and a data output section 80.

In addition, the layout data verification section 50 is provided with a logic connection verification section 60 and a layout data verification section 70.

In the layout making equipment 20 of a semiconductor integrated circuit of the first embodiment in the present invention, the data flow in the logic circuit schematic design section 30, the layout data creation section 40, the logic connection verification section 60, the layout data verification section 70, and the data output section 80 is shown in FIG. 2.

In addition, for the composition and data flow in the layout creation equipment 20 of the first embodiment in the present invention, as shown in FIG. 2, the logic connection verification section 60 shall be composed of a device connection extraction section 62, a logic connection restoration section 64, a logic connection conversion section 66, and a logic connection verification section 68. In addition, a layout data verification section 70 may be also composed of a layout data recognition section 72 and a layout data verification section 74. The composition and data flow in the layout making equipment 20 of a semiconductor integrated circuit of the first embodiment in the present invention are not limited to those as shown in FIG. 1 and FIG. 2 only.

Next, the operation flow of the layout making equipment 20 of a semiconductor integrated circuit of the first embodiment in the present invention is described in detail with reference to the drawings. FIG. 3 is a flowchart showing one example of the processing of a method of creating a layout data of the first embodiment in the present invention.

As shown in FIG. 3, a designer first determines a specification on a semiconductor integrated circuit (the specification data 10 on a semiconductor integrated circuit, step S101).

Next, the designer designs a logic circuit diagram, based on the specification data 10 on the semiconductor integrated circuit using the logic circuit schematic design section 30 (step S102).

Next, the layout data creation section 40 creates a layout data, based on the logic circuit diagram designed in step S102 (step S103).

Next, the logic connection verification section 60 executes LVS to restore a connection data on a gate level from the layout data and further convert the connection data on the gate level into a connection data on a transistor level. It collates and confirms whether or not the connection data on the transistor level matches the data on the logic circuit diagram and further collates and confirms whether or not a data on potentials inputted in nodes of the devices and nodes of connections between the devices match the data on the logic circuit diagram (step S104).

Figure 4B:
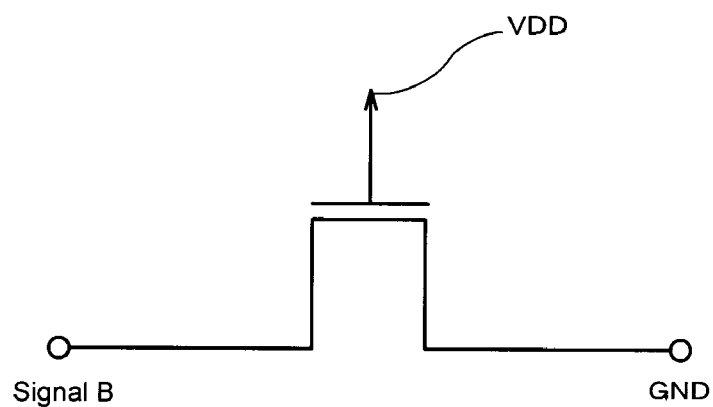
FIG. 4B is a diagram showing one example of a circuit diagram of FIG. 4A of the first embodiment in the present invention.

For example, in case this is described by using FIG. 4A and FIG. 4B, a connection data on a MOS transistor 200 is extracted from the layout data. Namely, as shown in FIG. 4A, a data that a gate line 202 is connected to a fixed potential VDD, a data that a word line 203a is connected to a Signal B that is a special signal formed inside the circuit, and a data that a word line 203b is connected to a power supply potential GND are extracted. Whether or not these connection data match the data on the logic circuit diagram is verified by LVS.

If the connection data on the transistor completely matches the data on the logic circuit diagram and the data on the potentials inputted in the nodes of the devices and the nodes of the connections between the devices completely match the data on the logic circuit diagram as a result of the verification by LVS in step S104, the logic connection verification section 60 judges that there are not any error portions in the layout data (step S105). The logic connection verification section 60 outputs a report of the judgment results to the layout data creation section 40, and the layout data verification section 70 executes the verification processings after step S106 later described.

On the other hand, if the connection data on the transistor does not completely match the data on the logic circuit diagram or the data on the potentials inputted in the nodes of the devices and the nodes of the connections between the devices do not completely match the data on the logic circuit diagram as a result of the verification by LVS in step S104, the logic connection verification section 60 judges that there are some error portions in the layout data (step S105). The logic connection verification section 60 outputs a report of the error portions to the layout data creation section 40 (step S108).

Next, the layout data creation section 40 revises the layout data on the portions that are reported of errors by the logic connection verification section 60 as a result of the verification by LVS (step S109). The logic connection verification section 60 executes again the verifications in step S104 to step S105 on the revised layout data by LVS. The layout data creation section 40 and the logic connection verification section 60 iteratively execute the verification in step S104 to step S105 and the revising works in step S108 to step S109 subsequent thereto until any error portions are not detected in step S105.

The layout data verification section 70 executes DRC following the foregoing verification processing by LVS.

In the first place, the layout data verification section 70 extracts data such as widths and spaces of lines (lines and spaces) from the layout data created in step S103 as dimensional graphics. The layout data verification section 70 identifies what nodes the extracted graphics data are, based on the data on the node extracted in the process of executing LVS.

For example, in case it is described by using FIG. 4A and FIG. 4B, the layout data verification section 70 extracts graphics data such as shown in FIG. 4A from the layout data. Only this is merely a dimensional data, it is not understood what node is of this graphics. Then, it identifies what nodes the extracted graphics data is, based on such a data on the node shown in FIG. 4B extracted by the logic connection verification section 60 in the process of executing LVS. This allows the system to identify the graphics in 202 to be a gate line and the graphics in 203a and 203b to be word lines, respectively.

Whether or not the data on the graphics that has identified the content of the node violates a design rule extracted by the layout data verification 70 from the specification data 10 on the semiconductor integrated circuit in step S101 is verified (step S106).

Namely, in the DRC of the first embodiment in the present invention, whether or not it meets the allowable minimum dimension value of the design rule (S7, W2) is verified. In addition to this verification, for example, for the gate line 203a connected to a special signal formed inside the circuit, because defects such as short-circuiting caused by dielectric breakdown occur, a bigger space value of the gate line 202 than that of the word line 203b connected to a power supply potential GND is verified (S5>S7). In addition, the allowable minimum dimension values on what the line width of the gate line 203b connected to a special signal formed inside the circuit is bigger than that of the word line 203b connected to the power supply potential GND (W1>W2) and the like are predetermined by the design rule, and whether or not a graphic data violates the design rule is verified.

If such a verification is performed in DRC and values such as widths and spaces of all the lines (lines and spaces) in the graphics data extracted from the layout data meet the allowable minimum dimension values determined by the design rule, the layout data verification section 70 judges that there are not any error potions that violate the design rule in the layout data (step S107) and outputs a report of the judgment results to the layout data creation section 40.

If the layout data verification section 70 judges that there are not any error portions in the graphics data extracted from the layout data in step S107, the layout data creation section 40 judges that the layout data is completed (step S110) and gives the completed layout data to the data output section 80. The data output section 80 is composed of a display or a printer and displays the completed layout data on the display or prints it out to output the judgment results (step S111).

On the other hand, if there are any values of such as widths an spaces of each line (lines and spaces) in the graphics data extracted from the layout data do not meet the allowable minimum dimension values defined by the design rule as a result of the verification by DRC, the layout data creation section 70 judges that there are error portions that violate the design rule in the layout data (step S107). The layout data verification section 70 outputs a report of the error portion to the layout data creation section 40 (step S108).

Next, the layout data creation section 40 revises the portion on which the layout data verification section 70 reports of an error as a result of the verification by DRC (step S109). The layout data verification section 70 executes again the verification processing in step 106 to step 107 by DRC on the revised layout data. The layout data creation section 40 and the layout data verification section 70 iteratively execute the verification processing in step S106 to step 107 and the revising works in step S108 to step S109 until any error portion is not detected in step S107.

Figure 5:
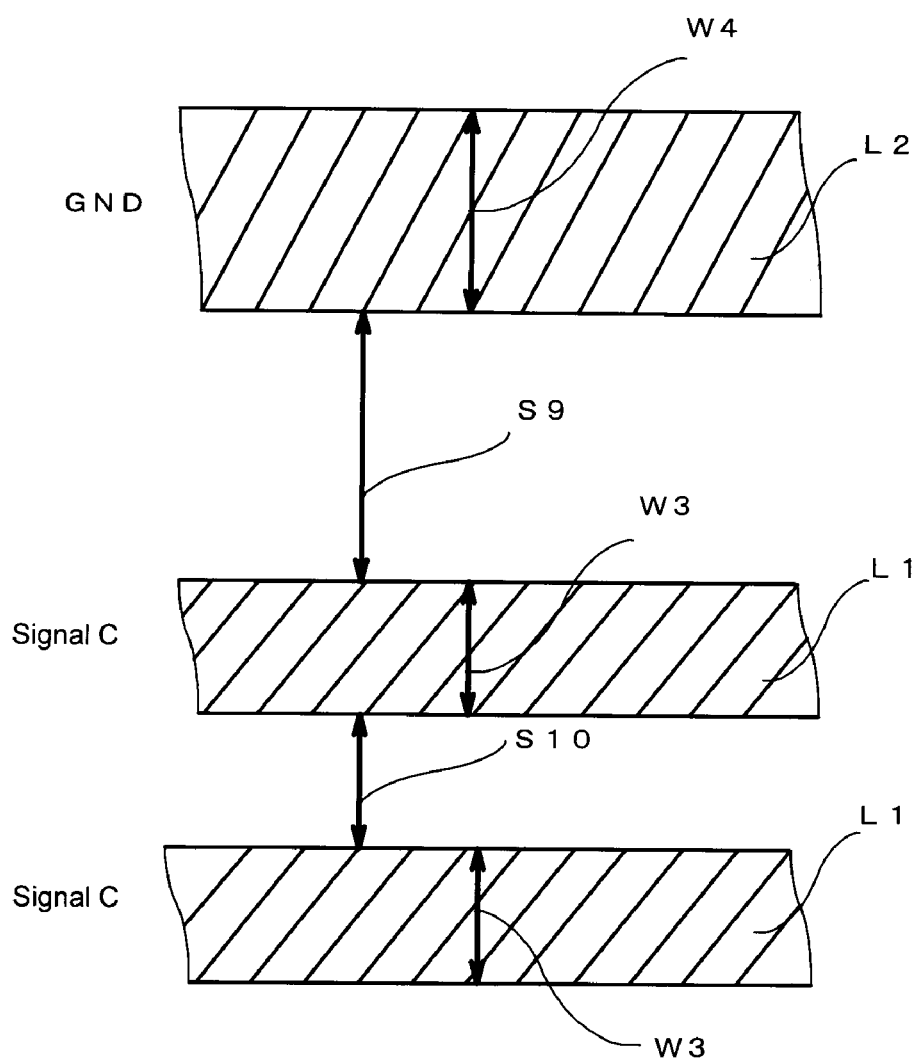
FIG. 5 is a cross-section shown by extracting one example of a layout of a word line that composes a part of a circuit diagram of the first embodiment in the present invention.

As is described in the foregoing, according to the first embodiment in the present invention, DRC is executed based on the data on the devices and the connections between the devices and the data on the potentials inputted in the nodes of the devices and the nodes of the connections between the devices extracted in the process that executes the verification of LVS. The layout verification processing by the DRC may be also applied to, for example, such a circuit diagram shown in FIG. 5. FIG. 5 is a cross-section shown by extracting one example of the layout of a word line that composes a part of the circuit diagram. In FIG. 5, the line L1 is connected to the Signal C that is a normal signal, and the line L2 is connected to a power supply potential GND. In addition, the line width value W3 of the line L1 and the line width value W4 of the line L2 defined by the design rule are in a relation of W4>W3. In addition, the space value S9 between the L2 and the line L1 and the space value S10 between the lines L1 defined by the design rule are in a relation of S9>S10, and S10 is the allowable minimum dimension value between lines defined by the design rule.

In FIG. 5, the line L2 is a line connected to the power supply potential GND, is more thickened than the line L1 connected to a normal signal (W4>W3), and it is requested that the bigger space value S9 between the line L2 connected to the power supply potential GND and the line L1 connected to a normal signal than the space value S10 between the lines L1 is secured (S9>S10). In order to also verify the design rule on such a node, DRC is executed with the value of S9 as a standard. The DRC inevitably judges that it is an error, even if S10 that is a smaller value than that of S9 meets the allowable minimum dimension value of the design rule. "An error in case the DRC judges that it is of an error because it does not meet the design rule severer than the allowable minimum dimension value, although it meets such an allowable minimum dimension value" is called a pseudo error.

If S10 shown in FIG. 5 is a pseudo error or is a value smaller than S10, in the first place, a judgment on whether or not it is a true error that does not meet the allowable minimum dimension value of the design rule can not help but rely on a personal working that an object has to be visually checked while confirming layout data one by one. Therefore, a true error may be overlooked by a personal mistake, even if enormous time and labor are spent for the working.

A node can be recognized by the node name of a logic circuit diagram, even if there is not any node identifying layer or the like in the layout data, and a pseudo error can be rejected from the verification results, by executing DRC on the circuit diagram shown in FIG. 5, based on the data on the devices and the connections between the devices and the data on the potentials inputted in the nodes of the devices and the nodes of the connections between the devices extracted in the process of verifying LVS described in the first embodiment. As a result, it is possible to verify both the allowable minimum dimension value and the design rule severer than the allowable minimum dimension value, thereby enabling the system to improve the reliability of a layout data that is created.

As is described in the foregoing, according to the first embodiment in the present invention, not only whether or not the layout data meets the allowable minimum dimension value can be verified, but also whether or not the layout data meets the design rule if the design rule severer than the allowable minimum dimension value is required can be also verified, by executing DRC, based on the data on the devices and the connections between the devices and the data on the potentials inputted in the nodes of the devices and the nodes of the connections between the devices extracted in the process of executing the verification of LVS. This verification processing allows pseudo errors to be automatically rejected out of errors detected by the layout check. In addition, a time required for the layout check can be shortened because DRC may be executed only once, different from the third embodiment later described. This allows the reliability of a created layout data to be improved. Therefore, the creation works of the layout data can be efficiently performed, thereby enabling the system to realize the shortening of a product development term and the reduction of a product development cost.

Second Embodiment

Although the verification of LVS is executed as a means to extract the node data in the afore-mentioned first embodiment, a circuit simulation is executed, besides the verification of LVS as the means to extract the node data in the second embodiment.

Figure 6A:
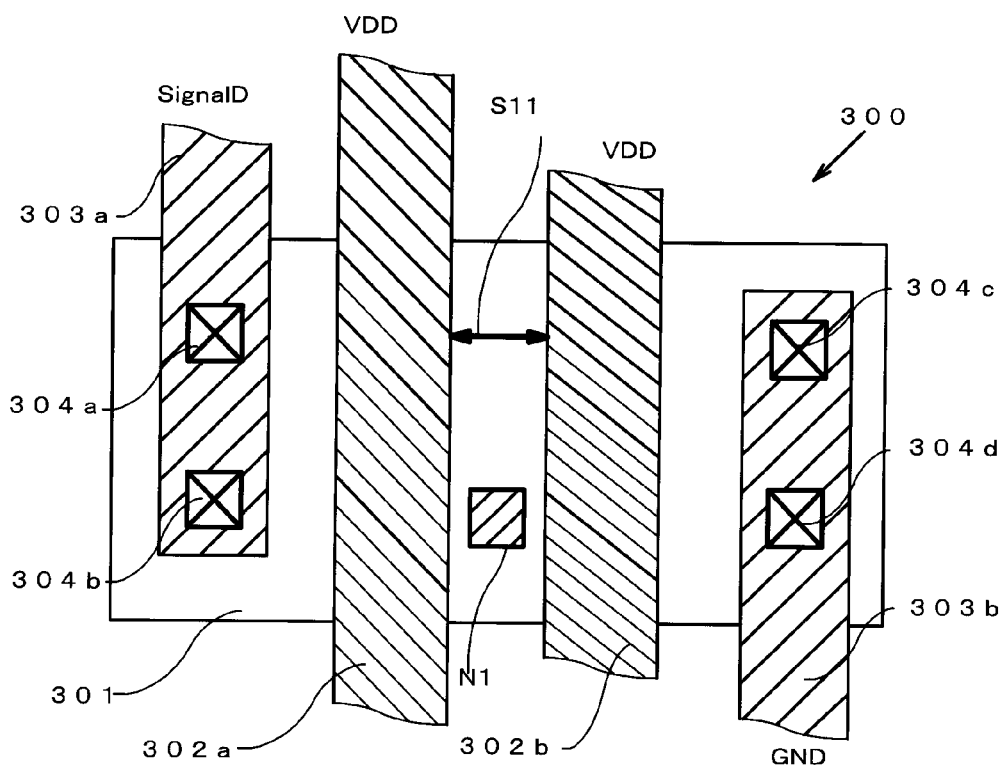
FIG. 6A is a cross-section showing one example of a circuit diagram of a MOS transistor that composes a part of a circuit diagram of a second embodiment in the present invention.
Figure 6B:
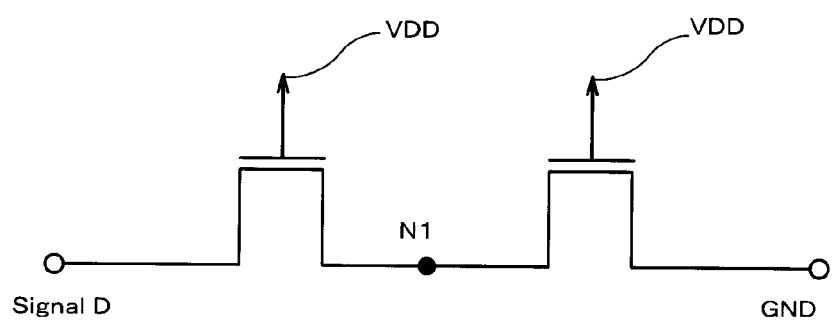
FIG. 6B is a diagram showing one example of a circuit diagram of FIG. 6A of the second embodiment in the present invention.

FIG. 6A is a cross-section of one example of the layout of the MOS transistor 300 that composes a part of the circuit diagram, FIG. 6B is a circuit diagram example of FIG. 6A. The MOS transistor 300 is composed of an active region 301, gate lines 302a, 302b, word lines 303a, 303b, and contacts 304a to 304d. In the MOS transistor 300, the gate lines 302a and 302b are connected to fixed potentials VDD's, the word line 303a is connected to the Signal D that is a normal signal, and the word line 303b is connected to the power supply potential GND. The space value of the gate lines is S11, and this is the allowable minimum dimension value of a design rule. In addition, N1 present in an intermediate region of the lines is in uncertain state of potential when the circuit is not operated. However, it is a node that is in a signal level equivalent to the normal Signal D when the circuit is operated (hereinafter referred to as "intermediate node").

Figure 7A:
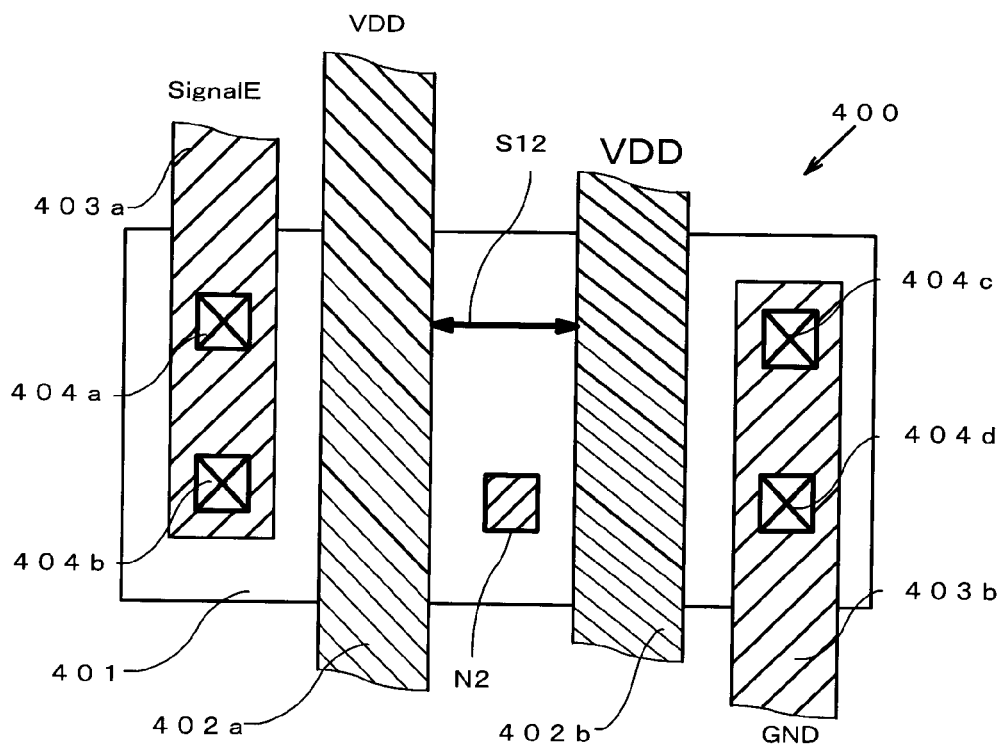
FIG. 7A is a cross-section showing one example of a layout of a MOS transistor that composes a part of a circuit diagram of the second embodiment in the present invention.
Figure 7B:
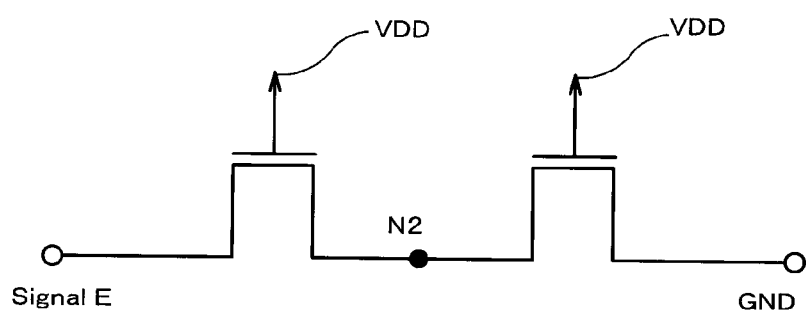
FIG. 7B is a diagram showing one example of a circuit diagram of FIG. 7A of the second embodiment in the present invention.

FIG. 7A is a cross-section of one example of the layout of the MOS transistor that composes a part of the circuit diagram, and FIG. 7B is a circuit diagram example FIG. 7A. The MOS transistor 400 is composed of an active region 401, gate lines 402a, 402b, word lines 403a, 403b, and contacts 404a to 404d. In the MOS transistor 400, the gate lines 402a and 402b are connected to fixed potential VDD's, the word line 403a is connected to the Signal E that is a special signal formed inside the circuit, and the word line 403b is connected to the power supply potential GND. The space value of the gate lines is S12, a relation with S11 in FIG. 7A is S11<S12. In addition, N2 is an intermediate node as in N1.

Because intermediate nodes N1 and N2 are in uncertain state of potential when the circuit is not operated, it is difficult to extract the data on the intermediate nodes N1 and N2 in the process of executing LVS. Therefore, for a node whose potential to be connected is fixed at a time when circuits such as intermediate nodes N1 and N2 are operated, it can't help relying on a manual operation that an operator visually checks objects while confirming the layout data one by one. Errors may be overlooked by a personal mistake, thereby causing defects such as short-circuiting due to dielectric breakdown to occur. Therefore, it is necessary to create a layout data from which errors on the intermediate nodes are also pre-rejected.

Then, in the second embodiment, it is described that it is possible to more detailedly verify the layout data by executing a circuit simulation to extract the data on the intermediate node, and by executing DRC, based on this data and a data on the node extracted in the process of executing LVS.

In addition, in the process of executing the circuit simulation, mistakes in a design of a logic circuit per se can be found out and revised, because whether or not there are malfunctions of the circuit is verified.

Thus, in the second embodiment, LVS and the circuit simulation are executed as a method to extract the data on the nodes.

Because the composition of the layout making equipment of the second embodiment in the present invention is the same one as shown in the FIG. 1 above, the illustration and description of the composition are omitted.

FIG. 8 is a flowchart showing one example of the processing of the layout data making equipment of the second embodiment in the present invention.

Because the operations of the second and the first embodiments are the same except for the operations of step S104 to step S106, the operations of step S104 to step S106 are described below.

In step S104, the logic connection verification section 60 executes LVS to restore a connection data on a gate level from the layout data and convert the connection data on the gate level into a connection data on a transistor level. The logic connection verification section 60 verifies whether or not the connection data on the gate level matches the data on the logic circuit diagram, and further collates and confirms whether or not the data on the potentials inputted in each node match the data on the logic circuit diagram. In addition, because the verification content of LVS is the same as in step S104 in the first embodiment, and the operations after step S108 performed, based on the judgment results of LVS are the same as in the first embodiment, the descriptions thereof are omitted.

In addition, the logic connection verification section 60 executes the circuit simulation to operate the circuit (step S104) and verifies whether or not malfunction would occur in the operation of the circuit (step S105). In addition, the potentials of the intermediate nodes N1 and N2 are fixed by operating the circuit, thereby enabling the system to extract to what potentials the intermediate node N1 and N2 are connected.

In step S105, if malfunctions do not occur in the operation of the circuit, the logic connection verification section 60 judges that there are not any error portions in the logic circuit diagram and gives the judgment results to the logic circuit schematic design section 30.

In step S105, if malfunctions occur in the operation of the circuit, the logic connection verification section 60 judges that there are some error portions in the logic circuit diagram and gives the judgment results to the logic circuit schematic design section 30 (step S108).

Next, the logic circuit schematic design section 30 revises the logic circuit diagram on the error portions reported by the logic connection verification section 60. The layout data creation section 40 revises the layout data, based on the revised logic circuit diagram (step S109).

Next, the logic connection verification section 60 executes again the verifications after step S104 on the revised logic circuit diagram and layout data in step S109. The logic connection verification section 60 and the layout data creation section 40 iteratively execute the verification processing until any error portion is not detected in step S105. If any error portion is not detected in step S105, the verification processings after S106 are executed.

The layout data verification section 70 executes DRC following the foregoing verification processings by LVS and the circuit simulation.

In step S106, the layout data verification 70 extracts the data on the widths and spaces of lines (lines and spaces) or the like as the dimensional graphics from the layout data created in step S103 and identifies what node the graphics data is, based on the data on the devices and the connections between the devices and the data on the potentials inputted in the nodes of the devices and the nodes of the connections between the devices extracted in the processes in step S104 to S105. In the DRC of the second embodiment, the layout data verification section 70 verifies whether or not the graphics data that also verifies the contents of the intermediate nodes N1 and N2 violates the design rule extracted from the specification data 10 on the semiconductor integrated circuit in step S101 (step S106). In addition, because the method of identifying the graphics, based on the data on the intermediate nodes N1 and N2 or the like are the same as in step S106 in the first embodiment, the descriptions thereof are omitted in the second embodiment.

As is described in the foregoing, according to the second embodiment in the present invention, not only whether or not the layout data meets the allowable minimum dimension value can be verified, but also whether or not the layout data meets a design rule in case the design rule severer than the allowable minimum dimension value is required can be also verified, by executing DRC, based on the data on the devices and the connections between the devices and the data on the potentials inputted in the nodes of the devices and the nodes of the connections between the devices extracted in the process of executing the verification by LVS. This allows pseudo errors to be automatically rejected out of errors detected by the layout check. In addition, because the execution of DRC can be performed only once, different from the fourth embodiment later described, a time required for the layout check can be shortened, thereby enabling the system to improve the reliability of the created layout data. Therefore, the creation working of the layout data is efficiently performed, thereby enabling the system to realize the shortening of a product development term and the reduction of a product development cost. In addition, the execution of the circuit simulation allows mistakes in a design on even a logic circuit diagram that is a premise of the creation of the layout data to be found out and revised.

Third embodiment

In the third embodiment, after DRC is first executed to verify whether or not the layout data meets the allowable minimum dimension value of a design rule, LVS is executed. Further, in the third embodiment, DCR is executed, based on the data on the devices and the connections between the devices and the data on the potentials inputted in the nodes of the devices and the nodes of the connections between the devices extracted in the process of executing LVS, thereby to verify whether or not the nodes meet the design rule.

Because the composition of the layout making equipment of the third embodiment in the present invention is the same one as shown in the FIG. 1 above, the illustration and description of the composition are omitted.

Figure 9:
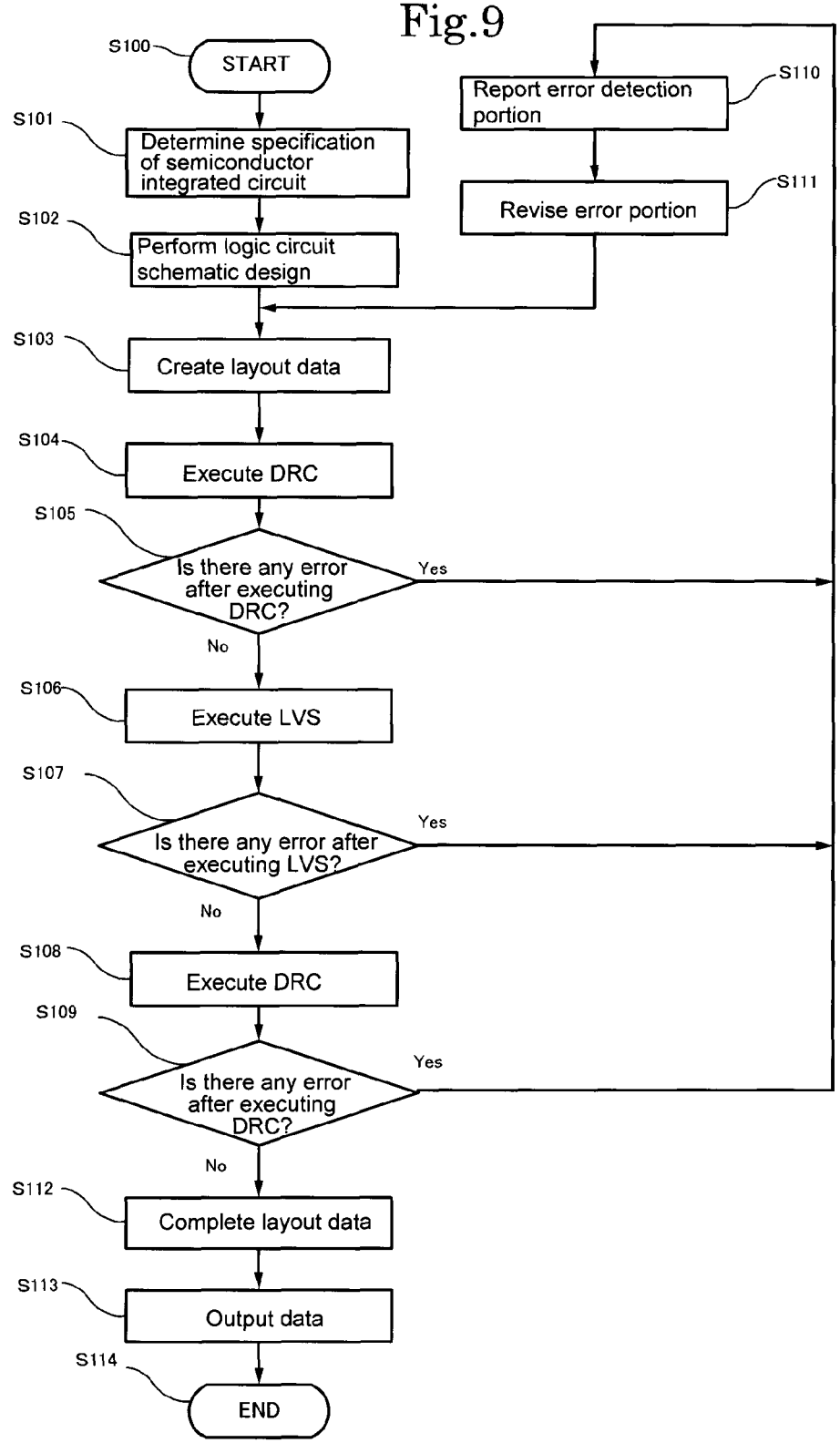
FIG. 9 is a flowchart showing one example of a method of creating a layout data of a third embodiment in the present invention.

FIG. 9 is a flowchart showing one example of the processing of a method of creating the layout data of the third embodiment in the present invention.

The other operations of the third and the first embodiments are the same except for the contents of DRC of step S104 and step S108. Therefore, the operations of step S104 and step S108 are described below.

In step S104, the layout data verification section 70 executes DRC to extract the data on the widths and spaces of the line (line and spaces) or the like as the dimensional graphics from the layout data created in step S103 and verify whether or not they violate the design rule extracted from the specification data on the semiconductor integrated circuit in step S101. Because the operations after step 110, based on the judgment results by DRC are the same as the ones after step S108 of the first embodiment, the descriptions thereof are omitted.

Because the DRC in step S104 is executed prior to LVS, it can't recognize the graphics data, based on the data on the node extracted by LVS. Therefore, the DRC in step S104 does not verify the design rule of the node. Therefore, data of portions that do not meet the design rule of the node even if they meet the allowable minimum dimension value may be included in the layout data on which DRC is executed in step S104 and judged not to be of errors. However, for pseudo errors, the DRC in step S108 verifies the design rule of the node, based on the data on the node extracted in the process of executing LVS in step S106 to step S107. The verification processing allows a portion of the data that does not meet the design rule on the node to be finally removed from the layout data.

Because the operation of the DRC in step S108 is the same as the one in step S106 of the first embodiment above-mentioned, the description thereof is omitted in the third embodiment.

As is described in the foregoing, not only whether or not the layout data meets the allowable minimum dimension value can be verified, but also whether or not the layout data meets the design rule in case a design rule severer than the allowable minimum dimension value is required can be also verified, by executing DRC, based on the data on the devices and the connection between the devices and the data on the potentials inputted in the nodes of the devices and the nodes of the connections between the devices extracted in the process of executing the verification by LVS. This verification processing allows pseudo errors to be automatically rejected out of errors detected by the layout check. This allows the reliability of a created layout data to be improved. Therefore, the creation works of the layout data can be efficiently performed, thereby enabling the system to realize the shortening of a product development term and the reduction of a product development cost.

Fourth Embodiment

In the third embodiment above-mentioned, the verification using LVS is executed as the means to extract the node data. However, in the fourth embodiment, a circuit simulation is executed, besides the verification using the LVS as the means to extract the data on the devices and the connections between the devices and the data on the potentials inputted in the nodes of the devices and the nodes of the connections between the devices.

Because the composition of the layout making equipment of the fourth embodiment in the present invention is the same as the one shown in FIG. 1 above, the illustration and the description of the composition are omitted.

Figure 10:
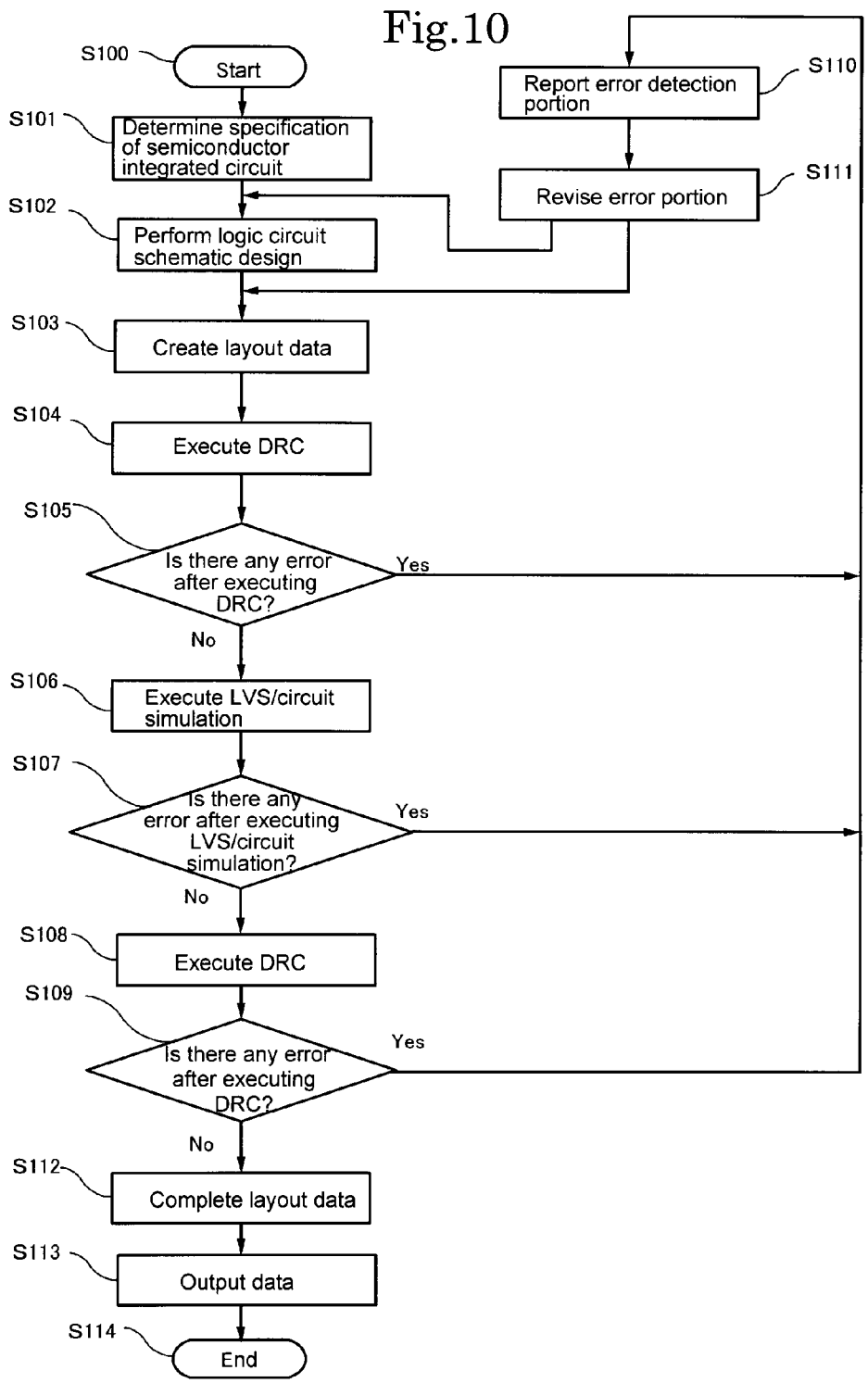
FIG. 10 is a flowchart showing one example of a method of creating a layout data of a fourth embodiment in the present invention.

FIG. 10 is a flowchart showing one example of the processing of a method of crating the layout data of the fourth embodiment in the present invention.

Because the other operations of the fourth embodiment and the third embodiment are the same except for the operations of step S106 to step S107, the operations of step S106 to step S107 are described below.

The connection verification section 60 executes LVS in step S106 to restore the connection data on a gate level from the layout data and further convert the connection data on the gate level into a connection data on a transistor level. The connection verification section 60 further collates and confirms whether or not the connection data on the transistor level matches the data on the logic circuit diagram and whether or not the data on the potentials inputted in each node match the data on the logic circuit diagram. In addition, because the verification content of LVS is the same as in step S104 in the first embodiment, the description thereof is omitted in the fourth embodiment. In addition, because the operations after S110 performed based on the judgment results of LVS are the same as those after step S108 in the first embodiment, the descriptions thereof are also omitted.

In addition, the logic connection verification section 60 executes the simulation circuit to operate the circuit (step S106) and verify whether or not any malfunction occur in the operation of the circuit (step S107). In addition, it extracts intermediate nodes in the process thereof. In addition, because the operations after step S107 of the circuit simulation are the same as the ones after S105 of the second embodiment, the descriptions thereof are omitted in the fourth embodiment.

As is described above, according to the fourth embodiment in the present invention, not only whether or not the layout data meets the allowable minimum dimension value can be verified, but also whether or not the layout data meets a design rule in case the design rule severer than the allowable minimum dimension value is required can be also verified, by executing DRC based on the data on the devices and the connections between the devices and the data on the potentials inputted in the nodes of the devices and the nodes of the connections between the devices extracted in the process of executing the verification by LVS. This verification processing allows pseudo errors to be automatically rejected out of errors detected by the layout check. This allows the reliability of a layout data that is created to be improved. Therefore, the creation works of the layout data can be efficiently performed, thereby enabling the system to realize the shortening of a product development term and the reduction of a product development cost. In addition, the execution of the circuit simulation allows mistakes in a design on even a logic circuit diagram that is a premise of the creation of the layout data to be found out and revised.

Fifth Embodiment

The verification is executed on data that depend upon nodes out of the layout data in the fifth embodiment. LVS is executed after DRC is executed, and DRC is further executed based on the node data extracted in the process of executing LVS. In addition, the fifth embodiment does not revise errors detected by DRC in step S104 and LVS in step S105 and revises errors detected by DRC in step S106 and step 107.

Because the composition of the layout making equipment of the fifth embodiment in the present invention is the same as the one show in FIG. 1 above, the illustration and the description of the composition are omitted.

Figure 11:
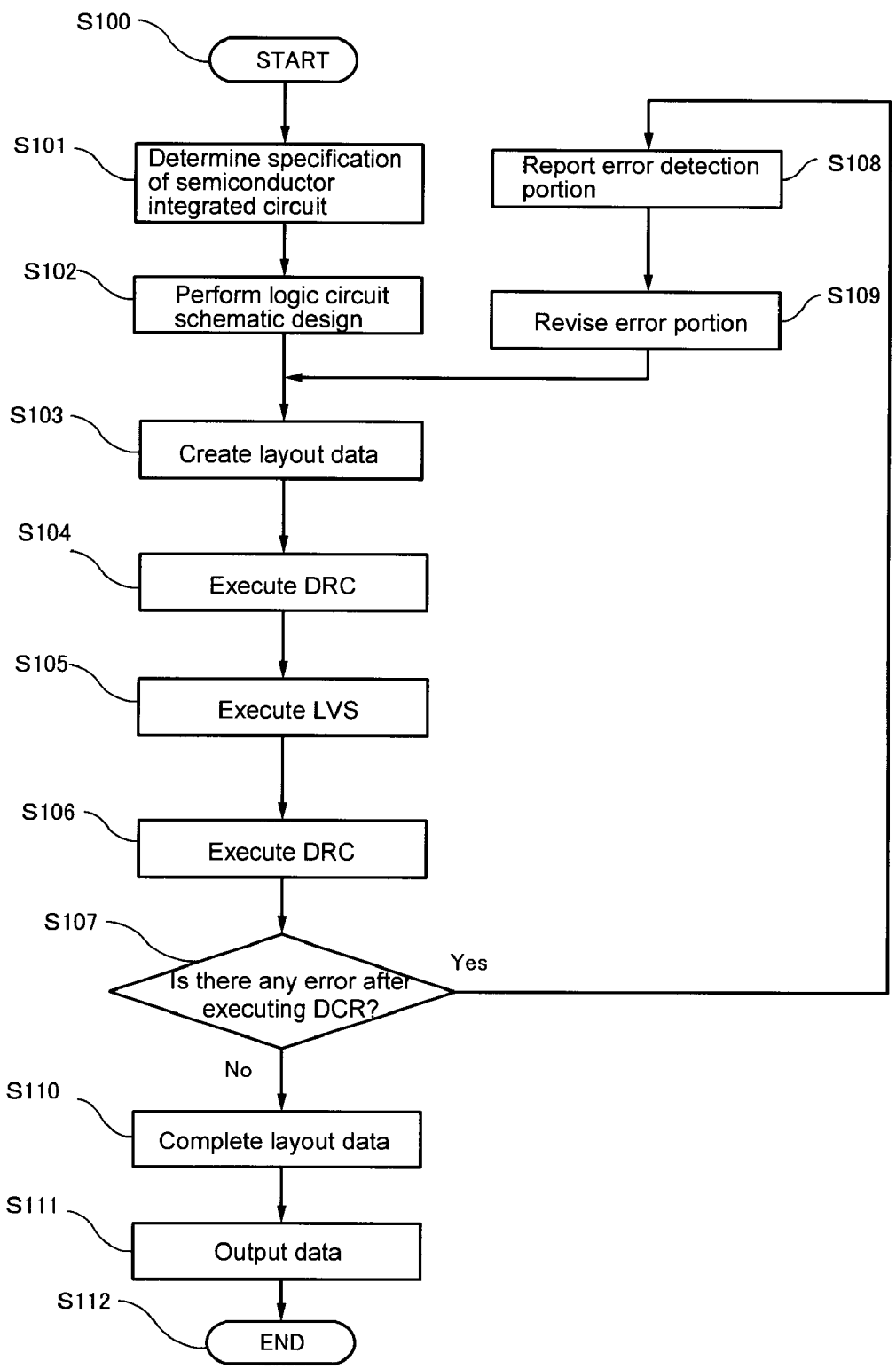
FIG. 11 is a flowchart showing one example of a method of creating a layout data of a fifth embodiment in the present invention.

FIG. 11 is a flowchart of one example of the processing of the layout making equipment of the fifth embodiment in the present invention.

Step S104 to step S107 are described in the fifth embodiment.

In step S104, the layout data verification section 70 extracts the data on a layout data that depends upon the nodes as the dimensional graphics from the layout data created in step S103. It further extracts a design rule that depends upon nodes from the specification data on a semiconductor integrated circuit in step S101 to verify whether or not the graphics data violates the design rule. Because the operation of DRC in step S104 of the fifth embodiment is the same as in step S104 of the third embodiment, the description thereof is omitted. In addition, what data in the layout data that do not meet the design rule of the node even if they meet the allowable minimum dimension value out of the data judged not to be of errors by DRC in step S104 of the fifth embodiment are included is also the same as in step S104 of the third embodiment.

Next, the logic connection verification section 60 executes LVS to restore the connection date on the gate level from the layout data and further convert the connection data on the gate level into a connection data on a transistor level. The logic connection section 60 collates and confirms whether or not the connection data on the transistor level matches the data on the logic circuit diagram or further whether or not the data on the potentials inputted in the nodes of the devices and the connections between the devices matches the data on the logic circuit diagram (step S105). In LVS of the fifth embodiment, the layout data creation section 40 does not execute the operations after step S108 as in the first embodiment, and the layout data verification section 70 executes the operation of step S106. In addition, because the operation contents of LVS in step S105 are the same as in step S104 of the first embodiment, the descriptions thereof are omitted in the fifth embodiment.

Next, the layout data verification section 70 executes DRC and identifies the graphics data extracted in step S104, based on the data on the devices and the connections between the devices and the data on the potentials inputted in the nodes of the devices and the nodes of the connections between the devices extracted in the process of executing LVS in step S105. Because the other operation contents of DRC in step S106 are the same as in step S106 of the first embodiment, the descriptions thereof are omitted.

Because DRC in step S104 is executed prior to LVS, it can't recognize the graphics data, based on the data on the devices and the connections between the devices and the data on the potentials inputted in the nodes of the devices and the nodes of the connections between the devices extracted in the process of executing LVS. For that reason, DRC in step S104 does not verify the design rule of the nodes. Therefore, portions of the data that do not meet the design rule of the node even if they meet the allowable minimum dimension value may be included in the layout data that is judged not to be of an error by executing DRC in step S104. However, DRC in step S106 verifies the design rule of the node on the pseudo error, based on the data on the devices and the connections between the devices and the data on the potentials inputted in the nodes of the devices and the nodes of the connections between the devices extracted in the process of executing LVS in step S105. This verification processing allows portions that do not meet the design rule of the node to be finally removed from the layout data.

As is described in the foregoing, according to the fifth embodiment in the present invention, a partial verification may be executed on the layout data, and a time required for the layout check can be shortened. In addition, even in the fifth embodiment, not only whether or not the layout data meets the allowable minimum dimension value can be verified, but also whether or not the layout data meets the design rule in case a design rule severer than the allowable minimum dimension value is required can be also verified, by executing DRC based on the data on the devices and the connections between the devices and the data on the potentials inputted in the nodes of the devices and the nodes of the connections between the devices extracted in the process of executing the verification by LVS. This verification processing allows pseudo errors to be automatically rejected out of errors detected by the layout check. This allows the reliability of a created layout data to be improved. Therefore, the creation works of the layout data can be efficiently performed, thereby enabling the system to realize the shortening of a product development term and the reduction of a product development cost.

Sixth Embodiment

In the sixth embodiment, a circuit simulation is executed besides the verification of LVS as the means to extract the node data.

Because the composition of the layout making equipment of the sixth embodiment in the present invention is the same as in FIG. 1 above, the illustration and the description of the composition are omitted.

Figure 12:
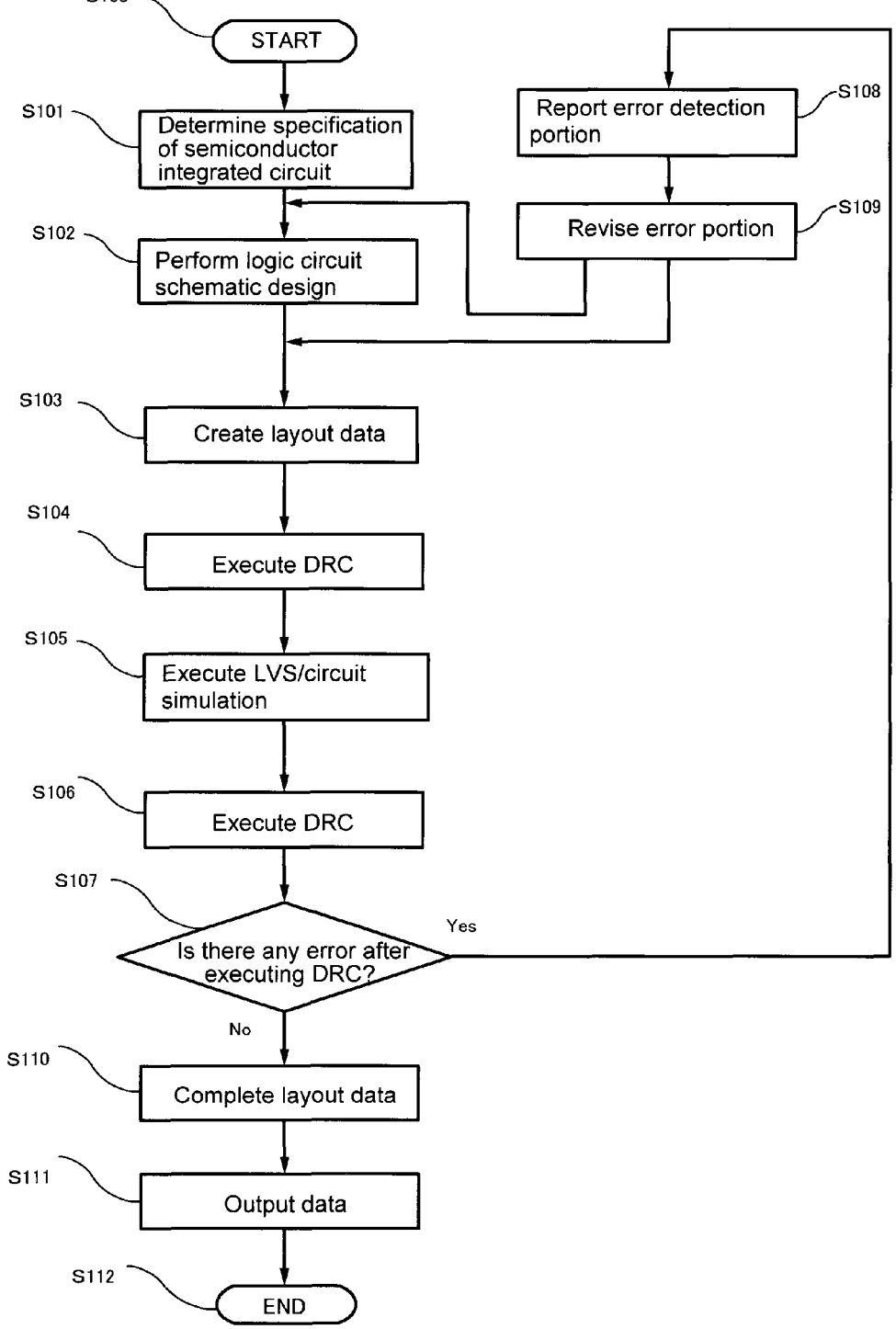
FIG. 12 is a flowchart showing one example of a method of creating a layout data of a sixth embodiment in the present invention.

FIG. 12 is a flowchart showing one example of the processing of a method of creating the layout data of the sixth embodiment in the present invention.

The other operations of the sixth and the fifth embodiments are the same except for the operation of step S105.

In addition, because the operation of step S105 is the same as in step S104 of the second embodiment, the description thereof is omitted in the sixth embodiment.

As is described in the foregoing, according to the sixth embodiment in the present invention, a partial verification may be executed on the layout data, and a time required for the layout check can be shortened. In addition, even in the sixth embodiment, not only whether or not the layout data meets the allowable minimum dimension value can be verified, but also whether or not the layout data meets the design rule in case a design rule severer than the allowable minimum dimension value is required can be also verified, by executing DRC based on the data on the devices and the connections between the devices and the data on the potentials inputted in the nodes of the devices and the nodes of the connections between the devices extracted in the process of executing the verification by LVS. This verification processing allows pseudo errors to be automatically rejected out of errors detected by the layout check. This allows the reliability of a created layout data to be improved. Therefore, the creation works of the layout data can be efficiently performed, thereby enabling the system to realize the shortening of a product development term and the reduction of a product development cost. In addition, the execution of the circuit simulation allows mistakes in a design on even a logic circuit diagram that is a premise of the creation of the layout data to be found out and revised.

In addition, in the descriptions of the first embodiment to the sixth embodiment above, the examples in the case LVS and the circuit simulation are taken up as the means to extract the data on the extracted devices and the connections between the devices and the data on the potentials inputted in the nodes of the devices and the nodes of the connections between the devices. However, the composition and operations of the equipment are the same even if DRC is used.

In addition, in one embodiment in the present invention, it is also possible to select a specific area out of a circuit diagram and execute the verification on a layout data by limiting to the area. This allows the layout data to be partially verified and a time required for the layout check can be shortened.

In addition, in one embodiment in the present invention, it is also possible to select one or a plurality of nodes and execute LVS thereon. In addition, if pluralities of the nodes are selected and LVS is executed thereon, it is possible to sequentially or simultaneously execute verification on each of the selected nodes in parallel. This allows the layout data to be partially verified and a time required for the layout check to be shortened.

In addition, in one embodiment the present invention, the design rule extracted from the specification data on a semiconductor integrated circuit can be dividedly extracted; i.e., one is the design rule that does not depend upon the data on the extracted devices and the connections between the devices and the data on the potentials inputted in the nodes of the devices and the nodes of the connections between the devices, and the other is the design rule that depends upon the data on the extracted devices and the connections between the devices and the data on the potentials inputted in the nodes of the devices and the nodes of the connections between the devices. This allows DRC to be also executed by selecting one or a plurality of specific design rules. This allows the layout data to be partially verified and a time required for the layout check to be shortened.

In addition, in one embodiment in the present invention, it is also possible to execute DRC by selecting one or a plurality of specific design rules. In addition, if DRC is executed by selecting a plurality of the design rules, it is possible to execute sequentially or simultaneously the verification on each of the selected design rules in parallel. This allows the layout data to be partially verified and a time required for the layout check to be shortened.

In addition, according to one embodiment in the present invention, there is provided the layout making equipment of a semiconductor integrated circuit, wherein the layout data is created by the layout data creation section, based on the data on the logic circuit diagram designed by the logic circuit schematic design section, and is revised based on error data detected by the verification of the logic connection verification section and the layout data verification section. This allows the reliability of the created layout data to be improved.

In addition, according to one embodiment in the present invention, there is provided the layout making equipment of a semiconductor, characterized by judging that there are some errors in the layout data if the data on the devices and the connections between the devices do not completely match the data on the logic circuit diagram extracted from the created layout data, or the data on the nodes of the devices, the nodes of the connections between the devices, and the potentials inputted in the connections between the devices do not completely match the data on the logic circuit diagram. This allows the reliability of the created layout data to be improved.

In addition, according to one embodiment in the present invention, there is provided the layout making equipment of a semiconductor integrated circuit, characterized by judging that there are some errors in the layout data if the created layout data violates the design rule included in the specification data on the semiconductor integrated circuit. This allows the reliability of the created layout data to be improved.

Seventh Embodiment

In the seventh embodiment, in manufacturing a multilayered structure semiconductor device, layout verification processing by DRC and LVS is executed on the layout data created by layer, a mask making data is created by layer from the layout data on which layout verification is over, and layout verification processing is executed on the mask making data of two adjacent layers by Layout Versus Layout (LVL).

Figure 13:
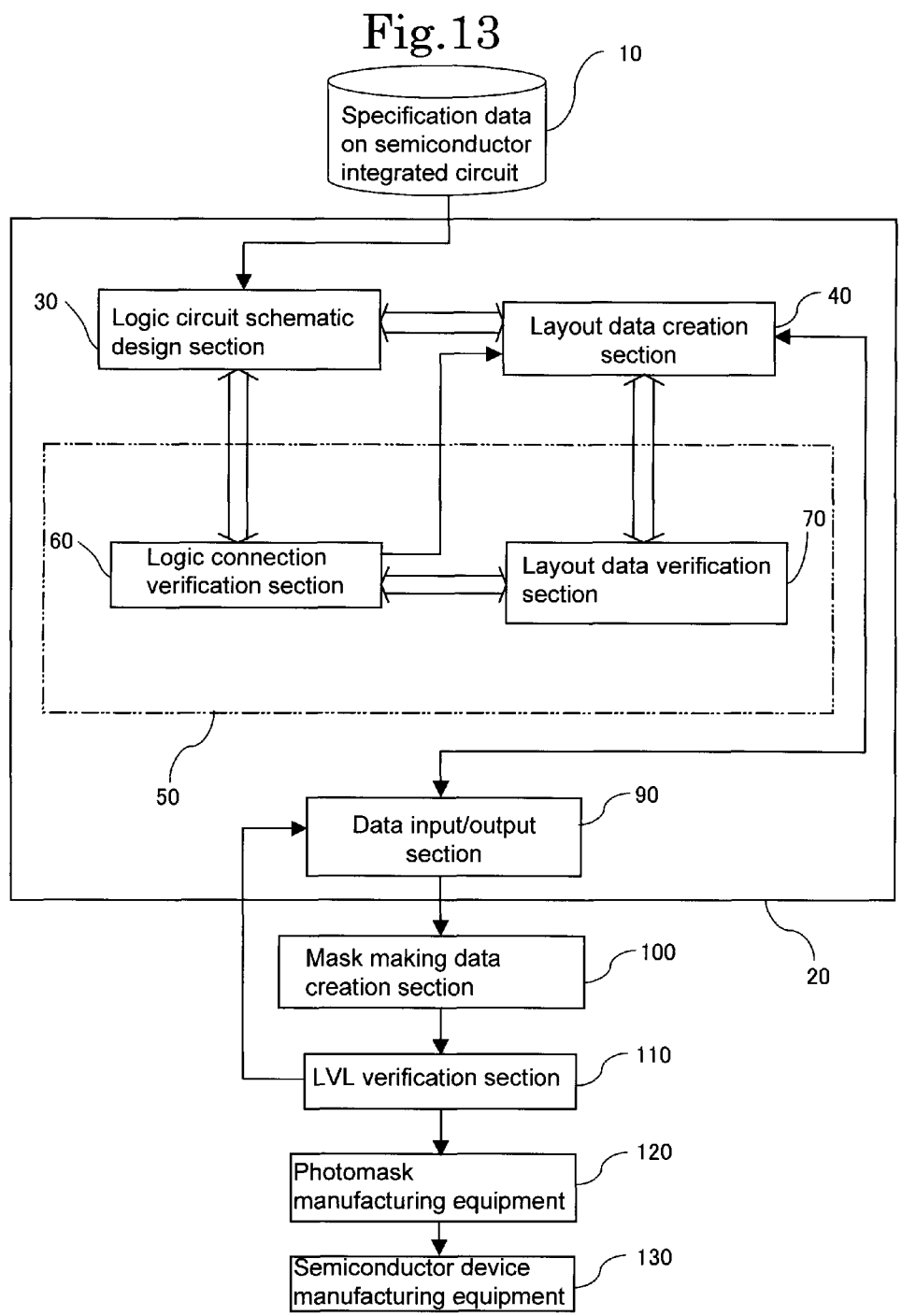
FIG. 13 is a block diagram showing a composition example of layout making equipment of a seventh embodiment in the present invention.

FIG. 13 is a block diagram showing a composition example of the layout making equipment of the seventh embodiment in the present invention. The layout making equipment of the seventh embodiment is, as shown in FIG. 13, provided with the logic circuit schematic design section 30 that designs the logic circuit diagram based on the specification data 10 on a semiconductor integrated circuit, the layer data creation section 40 that creates the layout data, based on the data on the logic circuit diagram designed by the logic circuit schematic design section 30, the layout data verification section 50, and the data input/output 90. The exterior section of the layout data making equipment 20 is provided with the mask making data creation section 100 that creates the mask making data for a photomask manufacture from the layout data, the LVL verification section (interlayer layout verification section) 110 that executes LVL between the mask making data of the two adjacent layers, the photomask manufacturing equipment 120 that manufactures the photomasks of each layer, based on the mask making data of each layer after LVL is executed, and the semiconductor device manufacturing equipment 130 that manufactures a semiconductor device, based on the manufactured photomasks of each layer.

The LVL verification section 110 outputs an error portion report to the data input/output section 90 if it extracts an error portion, when it executes LVL between the mask making data of the two adjacent layers. The data input/output section 90 outputs the layout data inputted from the layout data creation section 40 to the mask making data creation section 100 and executes output processing that outputs the error portion report inputted from the LVL verification section 110 to the layout data creation section 40.

Figure 14:
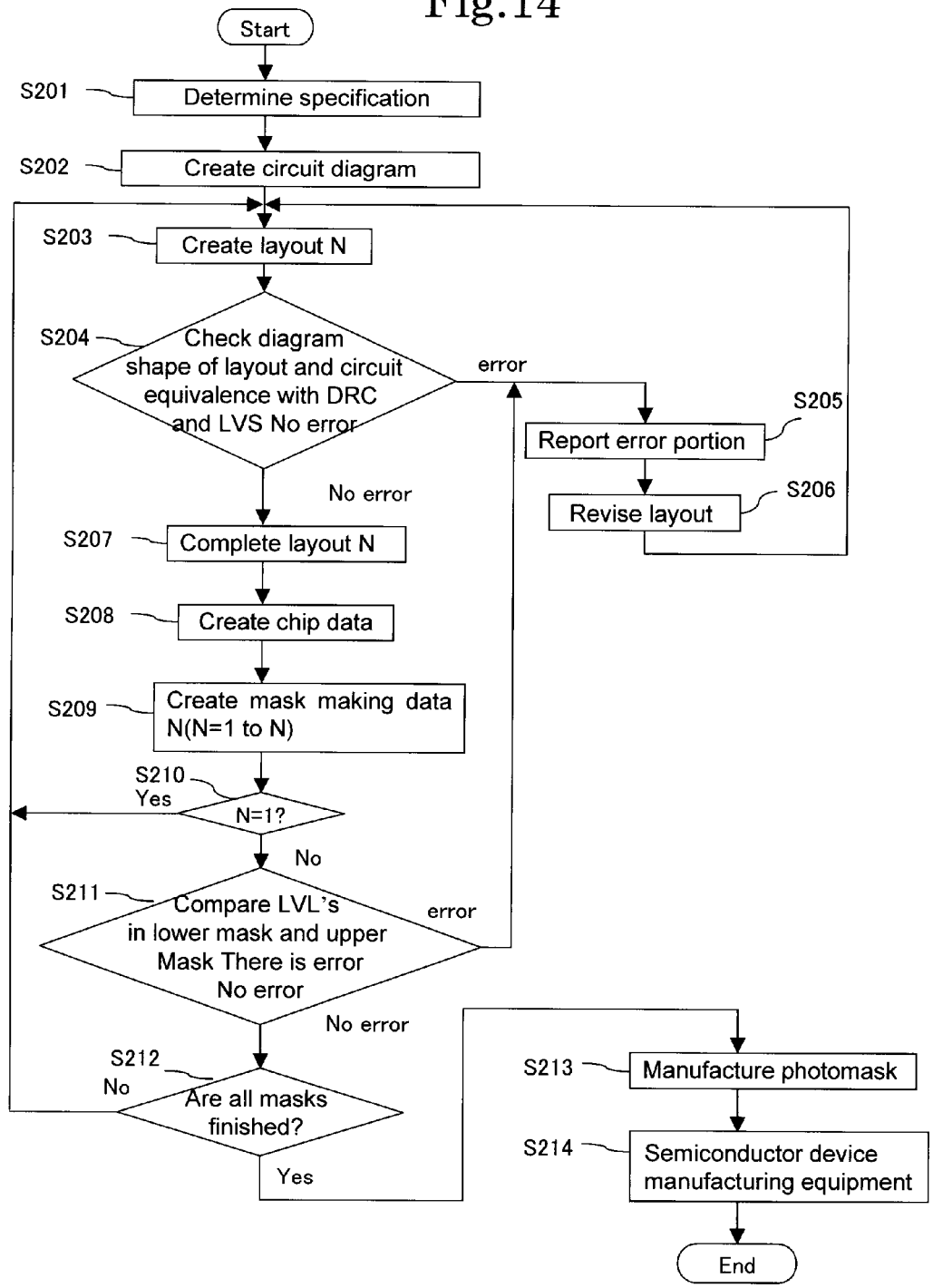
FIG. 14 is a flowchart showing one example of a method of creating a layout data of the seventh embodiment in the present invention.

Next, the layout data creation processing executed in the layout data making equipment 20 of the seventh embodiment 7 is described with reference to the flowchart shown in FIG. 14 and one example of the layout shown in FIG. 15 and FIG. 16.

In the first place, a specification on a semiconductor integrated circuit is determined, based on the specification data on the semiconductor integrated circuit (step S201), the logic circuit schematic design section 30 creates a circuit diagram, based on the specification (step S202). Next, the layout data creation section 40 creates the layout data N (including N=1, 2, 3, ..., N-1, N) corresponding to each layer in order to create the created circuit diagram as an actual chip data on a multilayered structure N (step S203).

Figure 15:
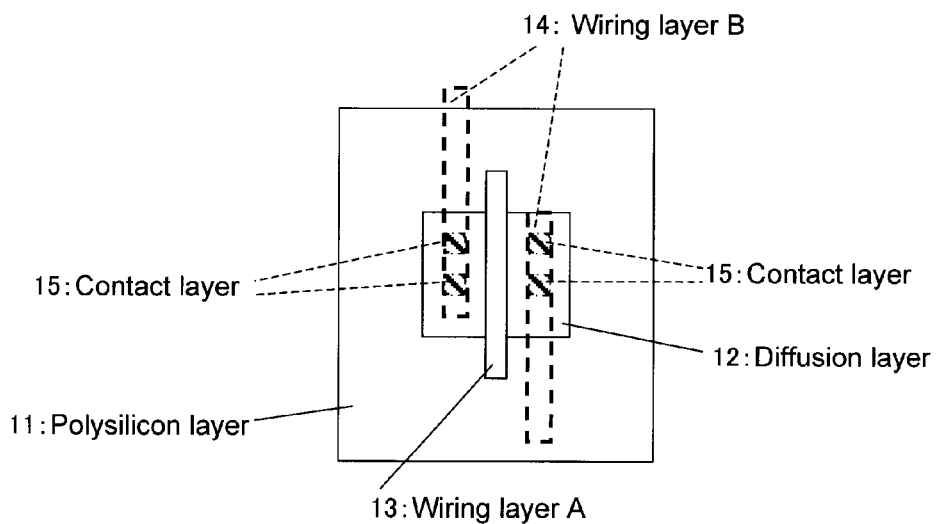
FIG. 15 is a plan view showing one example of a multilayered structure semiconductor integrated circuit of the seventh embodiment in the present invention.

At this time, one example of the created layout of a multilayered structure semiconductor integrated circuit is shown in FIG. 15. FIG. 15 is a plan view showing the layout of a memory transistor region in case a flash memory is applied as a semiconductor integrated circuit. A first layer-layout (continuous line) containing a polysilicon layer 11 and a diffusion layer 12 and a second layer-layout (continuous line and dotted line) containing a wiring layer A13, a wiring line layer B14, and a contact layer 15 are included in the memory transistor region. In this case, a first layer-semiconductor integrated circuit and a second layer-semiconductor integrated circuit are manufactured by using a first layer-mask making data 1 created based on the first layer-layout and a second layer-mask making data 2 created based on a second layer-layout. Thereafter, the composition is such that the second layer-semiconductor integrated circuit is overlapped on an upper layer of the first layer-semiconductor integrated circuit and the wiring layer A13, the wiring layer B14 and the contact layer A15 are connected to the formation position of the diffusion layer 12. FIG. 15 shows an image that the layout data from the polysilicon layer 11 to the diffusion layer 12 based on the first layer-layout is completed and the second layer-layout data that is to be created next is positioned on the upper layer thereof.

Figure 16:
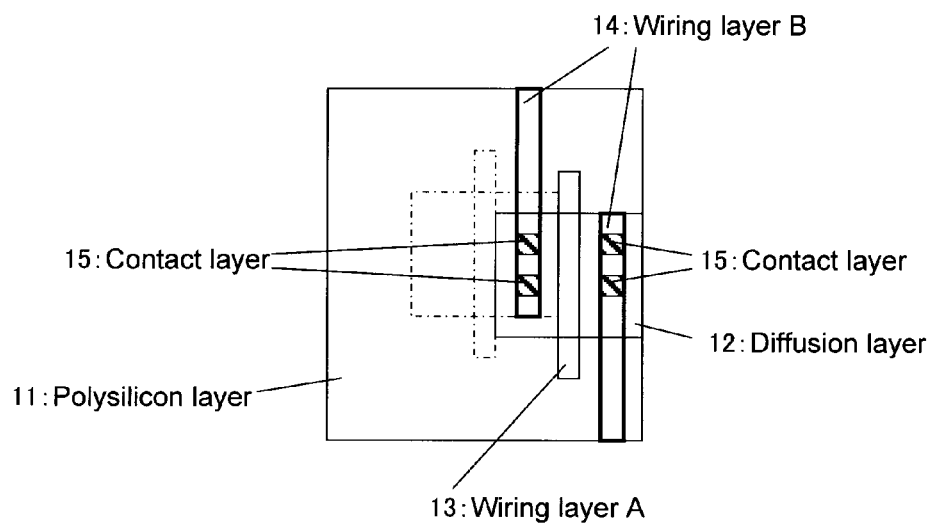
FIG. 16 is a plan view showing one example of a multilayered structure semiconductor integrated circuit of the seventh embodiment in the present invention.
Figure 17:
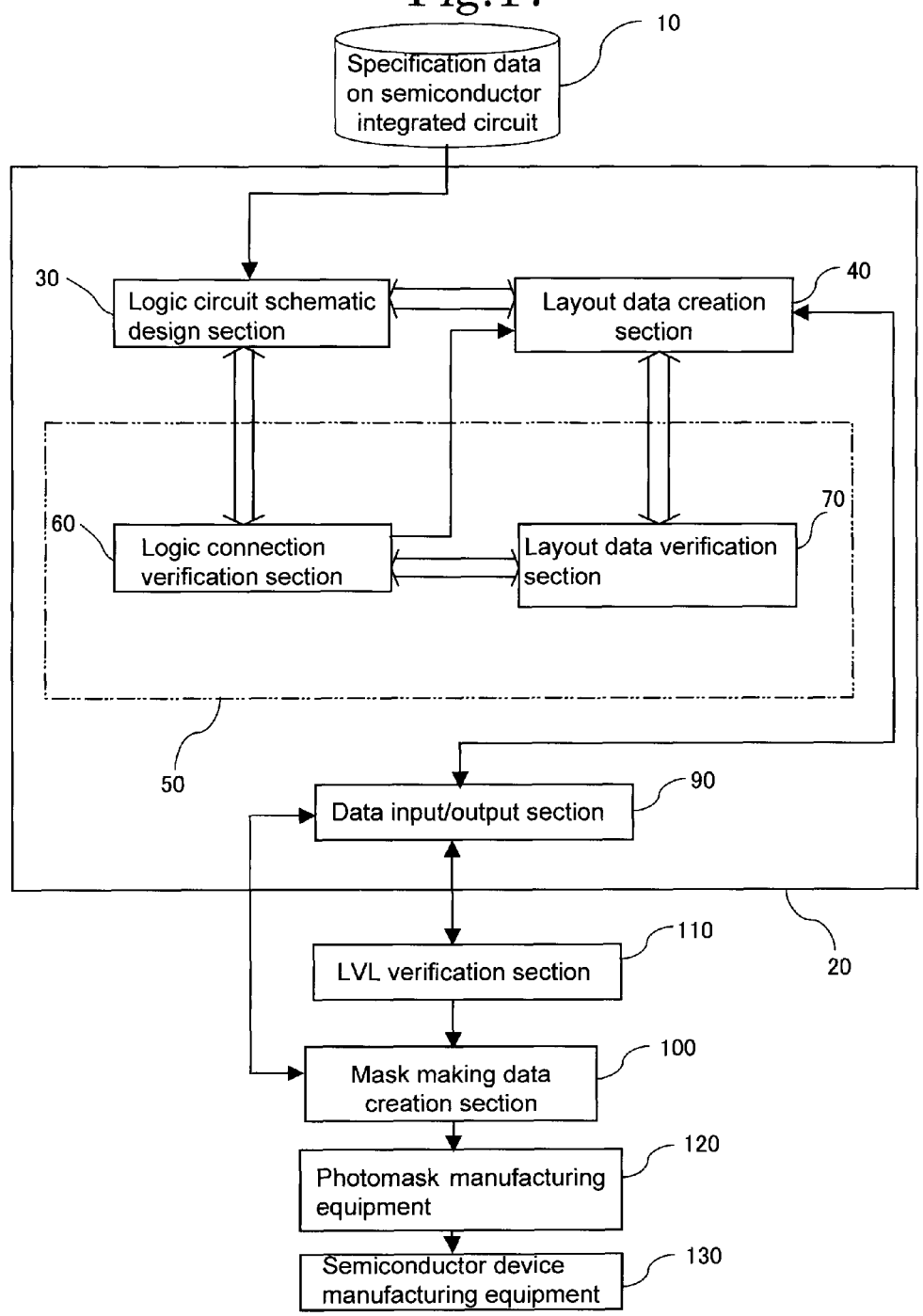
FIG. 17 is a block diagram showing a composition example of layout making equipment of an eight embodiment in the present invention.

FIG. 16 images the layout data where the wiring layer A13, the wiring layer B14 the contact layer 15 are completed based on the second layer-layout and the first layout data in FIG. 17 in the lower layer thereof. As shown in FIG. 15 and FIG. 16, if a multilayered structure semiconductor integrated circuit is being completed from a lower layer-mask, it is necessary to compare the previously created lower layer-mask making data with the adjacent upper layer-mask making data to confirm that the position of the lower layer is not moved. Therefore, in the seventh embodiment, the layout verification processing is executed by the LVL later described in the LVL verification section 100 in FIG. 13.

In an example where each layout of the first layer and the second layer shown in FIG. 16 is overlapped, the position of the first layer-layout is different from that of the first layer-layout shown in FIG. 15. In this case, if the first layer-layout remains as it stand, it is impossible to contact the wiring layer A13, the wiring layer B14, and the contact layer A15 in the second layer. Namely, for the first layout and the second layout, if layout check is performed on only the layouts in each layer by DRC and LVS, it is suggested that error portions are not extracted, and error portions are liable to occur in the interlayer connection when each layer is overlapped. Therefore, in the seventh embodiment, it is necessary to execute the LVL processing later described between the mask making data of each adjacent layer.

Next, returning to FIG. 14 to describe the processings after step S204. In step S204, the layout data verification section 70 first extracts graphics related to devices and lines from the first layer-layout data shown in FIG. 15, selects one or a plurality of design rules to each graphics to executes DRC thereon, and judges whether or not the existence or nonexistence of error portions. In addition, in step S204, the logic connection verification section 60 executes LVS to restore the connection data on the gate level from the firs layer-layout shown in FIG. 15, and further convert the connection data on the gate level into a connection data on a transistor level. The logic connection verification section 60 collates and confirms whether or not the connection data on the transistor level matches the data on the logic circuit diagram and further whether or not the data of the potentials inputted in the nodes of the devices and the nodes of the connections between the devices match the data on the logic circuit diagram to judge whether or not there are some error portions.

In step S204, if both the layout data verification section 70 and the logical connection verification section 60 or any of them judges there are some errors, both the layout data verification section 70 and the logical connection verification section 60 or any of them outputs an error portion report to the layout data creation section 40 (step S205). In this case, the layout data creation section 40 confirms the error portion report to modify the layout data (step S206). Thereafter, the processings in step S203 to step S206 are iteratively executed until error portions are not left.

In addition, if both the layout data verification section 70 and the logic connection verification section 60 judge that there are not any errors, the creation of the first layer-layout is completed (step S207), the creation of a first chip data is completed (step S208), and output the first layer-chip data to the data input/output section 90. The first layer-chip data is outputted from the data input/output section 90 to the mask making data creation section 100. The mask making data creation section 100 creates the first layer-mask making data 1, based on the first layer-chip data and outputs the same to the LVL verification section 110 (step S209).

The LVL verification section 110 holds the mask making data 1 and judges whether or not it is the first layer-mask making data 1 (N=1?) (step S210) if the mask making data 1 is inputted. If it judges that the mask making data 1 is the first layer (step S210: Yes), it putouts a second layer-layout data creation command to the data input/output section 90. The data input/output section 90 outputs the second layer-layout data creation command to the layout data creation section 40. Thereafter, the processings of the above step S203 to step S209 are iteratively executed to execute the creation processing of the second layer-layout data, the check processing of the second layer-layout data by DRC, LVS, and the creation processing of the mask making data 2.

Next, the LVL verification section 110 holds the mask making data 2 and judges whether or not it is the first layer-mask making data 1 (step S210) if the second layer-mask making data 2 is inputted from the mask making data creation section 100. It judges that the mask making data 2 is not the fist layer (step S210: No) and advances to step S211.

In step S211, the LVL verification section 110 executes LVL comparison processing of the held mask making data 1 (lower layer mask) and mask making data 2 (upper layer mask). In the LVL comparison processing, a difference between the mask making data 1 and the mask making data 2 is outputted, whether or not the position of the mask making data 1 is moved from the difference is verified to judge the existence or nonexistence of error portions. If the LVL verification section 110 judges that there are some errors, it outputs an error portion report to the data input/output section 90 (step S205). The error portion report is outputted to the mask making data creation section 100 from the data input/output section 90. In this case, the layout data creation section 40 confirms the error portion report and revises the layout data (step S206). Thereafter, the processings of step S203 to step S211 are iteratively executed until error portions are not left. Therefore, if it is judged that there are the error portions in the mask making data 1 of the lower layer by the LVL comparison processing, it is possible to revise the layout data so as to allow the relative position to be fitted with that of the mask making data 2 in the upper layer. Namely, it is possible to revise the position of the diffusion layer 12 in the first layer-layout data shown in FIG. 16 so as to match the positions of the wiring layer A13, the wiring layer B14 and the contact layer 15 in the second layer-layout data.

In addition, if the LVL verification section 110 judges that there are not any errors (step S211: no errors), it confirms whether or not the LVL comparison processing is finished over the mask making data in all the layers (step 212). If the LVL comparison processing is not finished over the mask making data in all the layers (step S212: No), it outputs the next layer layout data creation command to the layout data creation section 40 from the data input/output section 90. The layout data creation command is outputted to the layout data creation section 40 from the data input/output section 90. In this case, the processings of the above step S203 to step S211 are executed again. In addition, if the LVL verification section 110 finishes the LVL comparison processing over the mask making data in all the layers (step S212: Yes), it outputs all the mask making data N with no errors to the photomask manufacturing equipment 120. Therefore, it is possible to execute the layout verification processing by applying LVL to the mask making data of adjacent layers to the mask making data created from the layout data after the layout verification by DRC and LVS is over, by iteratively executing the processings of the above step S203 to step S212. In addition, the LVL verification section 110 holds the mask making data on the upper layer side out of the two mask making data after LVL comparison processing is over, before LVL comparison processing is over on the mask making data in all the layers, and perform LVL comparison processing with a mask making data in a further upper layers that are to be created next.

Next, the photomask manufacturing equipment 120 manufactures a photomask by layer having a mask pattern of each layer with EB lithography system or the like, based on all the mask making data N (N=1 to N) where LVL is verified in step S211 (step 213). Next, the semiconductor device manufacturing equipment 130 manufactures a semiconductor device by forming the pattern of the semiconductor integrated circuit or the like on a substrate by using photomasks of each layer manufactured in the photomask manufacturing equipment 120 (step S214). The processing of the seventh embodiment is finished after manufacturing the semiconductor device.

Next, a process of manufacture of a semiconductor device of the seventh embodiment is described. The process of manufacture of a semiconductor device of the seventh embodiment in the present invention includes a lithography process that performs pattern transfer on a substrate using a photomask where a mask pattern is formed, based on a layout data by layer where a layout is verified, and a mask making data where the relative position of adjacent interlayers is verified or a lithography process that directly plots the pattern of a layout data on a substrate by processing equipment using electron beam or the like. Namely, the process of manufacture of a semiconductor device of the seventh embodiment in the present invention creates a mask making data of each layer in the mask making data creation section 100, based on the layout data of each layer where the layout is verified and created by the layout making equipment 20. For mask making data of each layer, LVL comparison processing is performed on the mask making data of adjacent layers and the relative position between the mask making data is verified in the LVL verification section 110. Then, the photomask manufacturing equipment 120 forms a mask pattern of each layer into a photomask using the mask making data of each layer where the relative positions are verified. The semiconductor device manufacturing equipment 603 forms the pattern of a semiconductor integrated circuit by layer on a substrate with exposure using the photomasks of each layer. Or, the process of manufacture of a semiconductor device of the seventh embodiment in the present invention may form a pattern by directly plotting the layout data of each layer on a substrate by the processing equipment of electron beam or the like. The pattern usually forms a photosensitive resin thin film of photoresist or the like, and is formed by directly plotting the layout data on a substrate with exposure through a photomask or by the processing equipment of electron beam or the like. For example, a dopant diffusion layer is formed by performing a partial ion implantation onto the source and drain formation region of a transistor on a semiconductor substrate using the pattern. In addition, in a wiring formation process, a metal wiring layer of polysilicon, tungsten or the like is formed before and after a process that performs the above pattern transfer or a process using electron beam or the like. A desired metal wiring is obtained by processing the wiring layer in a process that performs the above pattern transfer or processing using electron beam or the like. Usually, a plurality of such metal wiring layers are formed while repeating the above process. Insulating films are usually provided between each of the metal wiring layers. In addition, the wiring layers on both sides sandwiching the insulating film are electrically connected by forming a connection conductor at a predetermined place in the insulating film. The foregoing processes of manufacture can form a pattern on the substrate, based on the layout data where reliability is well improved. A semiconductor device containing various fine semiconductor devices or the like incorporated inside the semiconductor device can be formed with high accuracy as well. Therefore, the process of manufacture of a semiconductor device allows reliability and yield in a semiconductor device to be improved.

As is described in the foregoing, according to the seventh embodiment in the present invention, the mask making data is created from the layout data of each layer on which the verification of the layout is over by DRC and LVS, LVL comparison processing is executed on the mask making data of adjacent layers to judge the existence or nonexistence of error portions in the mask making data in the lower layer, thereby enabling the system to revise the layout data corresponding thereto again.

Therefore, in manufacturing a multilayered structure semiconductor device, the layout verification processing by LVL can be applied to the mask making data of adjacent layers, besides the layout verification processing by DRC and LVS applied to the layout data of each layer. This application allows accuracy in layout verification processing to be improved, thereby enabling the system to further improve the quality of a layout design data.

In addition, according to the seventh embodiment in the present invention, a design study time of the layout data can be efficiently used, because the layout verification processing by DRC and LVS and the layout verification processing by LVL can be executed in batch. Moreover, the generation of pseudo errors or the like can be reduced, man-hour of revision processing of error portions can be reduced, and a design load of the layout data can be reduced, as verification processing is advanced onto layout data in upper layers, by executing the layout verification processings by LVL in batch from the layout data in the lower layer.

Eighth Embodiment

In the eighth embodiment, in manufacturing a multilayered structure semiconductor device, the layout verification processing by DRC and LVS is executed on the layout data created by layer and the layout verification processing by LVL is executed on the layout data of two adjacent layers out of the layout data on which the layout verification is over.

FIG. 17 is a block diagram showing a composition example of the layout making equipment of the eighth embodiment. Because the layout making equipment 20 shown in FIG. 17 is the same the one shown in FIG. 13 above-mentioned, the description of the composition is omitted. In addition, the mask making data creation section 100, the LVL verification section 110, the photomask manufacturing equipment 120, and the semiconductor device manufacturing equipment 130 are disposed in the exterior section of the layout making equipment 20 the same as the one shown in FIG. 17. In the composition, the LVL verification section 110 is disposed in the rear stage of the data input/output section 90, the mask making data creation section 100 is disposed in the rear stage of the LVL verification section 110, and the line that outputs data from the mask making data creation section 100 to the data input/output section 90 is added. These points are different from those of the composition in FIG. 13.

Figure 18:
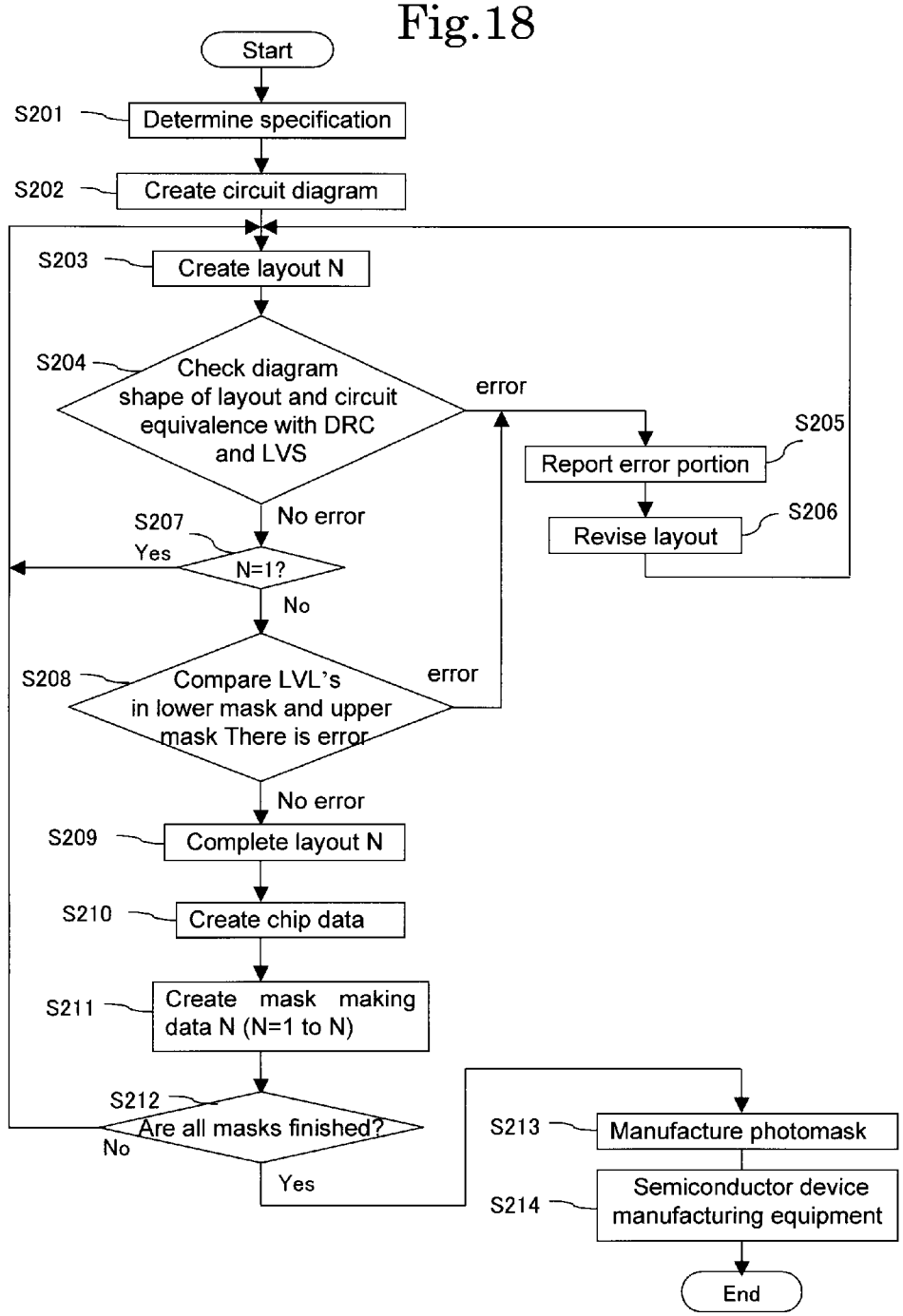
FIG. 18 is a flowchart showing one example of a method of creating layout data of the eighth embodiment in the present invention.

Next, the layout data creation processing executed in the layout data creation equipment 20 of the eighth embodiment is described with reference to the flowchart shown in FIG. 18 and one example of the layouts shown in FIG. 15 and FIG. 16.

In the first place, the specification on a semiconductor integrated circuit is determined, based on the specification data on a semiconductor integrated circuit (step S201), the logic circuit schematic design section 30 creates a circuit diagram, based on the specification (step S202). Next, the layout data creation section 40 creates a layout data N (including N=1, 2, 3, ... N−1, N) corresponding to each layer in order to create the created circuit diagram as an actual chip data of multilayered structure N (step S203).

Next, in step S204, the layout data verification section 70 first extracts graphics related to devices and lines from the first layer-layout data shown in FIG. 15, selects one or a plurality of design rules to each graphics to execute DRC thereon, and judges whether or not the existence or nonexistence of error portions. In addition, in step S204, the logic connection verification 60 executes LVS to restore a connection data on a gate level from the first layer-layout data shown in FIG. 15, and further convert the connection data on the gate level into a connection data on a transistor level. The logic connection verification section 60 collates and confirms whether or not the connection data on the transistor level matches the data on the logic circuit diagram and further whether or not the data of the potentials inputted in the nodes of the devices and the nodes of the connections between the devices match the data on the logic circuit diagram to judge the existence or nonexistence of error portions.

In step S204, if both the layout data verification section 70 and the logical connection verification section 60 or any of them judges that there are some errors, both the layout data verification section 70 and the logical connection verification section 60 or any of them outputs an error portion report to the layout data creation section 40 (step S206). In this case, the layout data creation section 40 confirms the error portion report to modify the layout data (step S206). Thereafter, the processings in step S203 to step S206 are iteratively executed until error portions are not left.

In addition, if both the layout data verification section 70 and the logical connection verification section 60 judge that there are not any errors, the first layer-layout data is outputted to the data input/output section 90. The first layer-layout data is outputted to the LVL verification section 110 from the data input/output section 90.

Next, the LVL verification section 110 holds the mask making data 1 and judges whether or not it is the first layer-mask making data 1 (N=1?) if the mask making data 1 in the first layer is inputted (step S207). If it judges that the mask making data 1 is the first layer (step S207: Yes), it outputs the next layer-layout data creation command to the data input/output section 90. The next layer-layout data creation command is outputted to the layout data creation section 40 from the data input/output section 90. Thereafter, the processings of the above step S203 to step S206 are iteratively executed to execute the making processing of the second layer-layout data, and the check processing of DRC, LVS of the second layer-layout data.

Next, the LVL verification section 110 holds the second layer-layout data and judges whether or not it is the first layer-layout data if the second layer-layout data is inputted from the mask making data creation section 100 (step S207). It judges that the layout data is not the fist layer (step S207: No) and advances to step S208.

In step S208, the LVL verification section 110 executes LVL comparison processing of the held first layer-layout data (lower layer-layout) and second layer-layout data (upper layer-layout). In the LVL comparison processing, a difference between the first layer-layout data and the second layer-layout data is outputted, whether or not the position of the first layer-layout data is moved from the difference is verified to judge the existence or nonexistence of error portions. If the LVL verification section 110 judges that there are some errors, it outputs an error portion report to the data input/output section 90 (step S205). The error portion report is outputted to the layout data creation section 40 from the data input/output section 90. In this case, the layout data creation section 40 confirms the error portion report to revise the first layer-layout data (step S206). Thereafter, the processings of step S203 to step S208 are iteratively executed until error portions are not left. Therefore, if it is judged that there are the error portions in the layout data of the lower layer by the LVL comparison processing, it is possible to revise the layout data so as to allow the relative position to be fitted with that of the layout data in the upper layer. Namely, it is possible to revise the position of the diffusion layer 12 in the first layer-layout data shown in FIG. 16 so as to match the positions of the wiring layer A13, the wiring layer B14 and the contact layer 15 of the second layer-layout data.

In addition, if the LVL verification section 110 judges that there are not any errors after the first layer-layout data where errors are revised is inputted from the data input/output section 90 (step 208: No), the creation of the fist layer-layout is completed (step S209), and the creation of the first layer-chip data is completed (step S210). The LVL verification section 110 outputs the first layer-chip data to the mask making data creation section 100.

Next, the mask making data creation section 100 creates the first layer-mask making data 1, based on the first layer-chip data (step S211). Next, the mask making data creation section 100 judges whether or not the creation of all the layer-mask making data is finished (step S212). If it judges that the creation of all the layer-mask making data is not finished (step S212: No), it outputs the next layer-layout data creation command to the data input/output section 90. The layout data creation command is outputted from the data input/output section 90 to the layout data creation section 40. In this case, the processing of step S203 to step S210 are executed again. In addition, if the mask making data creation section 110 finishes the creation of all the layer-mask making data (step S212: Yes), it outputs all the mask making data N to the photomask manufacturing equipment 120. Therefore, LVL may be applied to the layout data of adjacent layers to execute the layout verification processing on the layout data after layout verification is performed thereon by DRC and LVS, by iteratively executing the processings of the above step S203 to S212. In addition, the layout data on the upper layer side is out of the two layout data on which LVL comparison processing is performed is held, thereby enabling the system to perform LVL comparison processing on the layout data and a layout data of a further upper layers that are created next, before LVL comparison processing performed on layout data of all the layers is finished in the LVL verification section 110.

Because each processing of step S203 to step S214 is the same ones as described in the seventh embodiment, the description thereof is omitted.

As is described in the foregoing, according to the eighth embodiment in the present invention, LVL comparison processing is executed on the layout data of adjacent layers out of the layout data of each layer on which layout verification by DRC and LVS is finished to judge the existence or nonexistence of error portions in the layout data in the lower layer, thereby enabling the system to revise the layout data again.

Therefore, in manufacturing a multilayered structure semiconductor device, the layout verification processing by LVL can be applied onto the layout data of adjacent layers, besides the layout verification processing by DRC and LVS that is applied to the layout data of each layer. This application allows accuracy in layout verification processing to be improved, thereby enabling the system to further improve the quality of a layout design data.

Ninth Embodiment

In the ninth embodiment, in manufacturing a multilayered structure semiconductor device, the layout verification processing by LVL is executed on the layout data of two adjacent layers out of the layout data that are created by layer, and layout verification processing by DRC and LVS is executed on the layout data by layer after layout verification is performed thereon.

Because the composition of the layout making equipment of the ninth embodiment is the same one as shown in FIG. 17, the illustration and the description of the composition are omitted.

Figure 19:
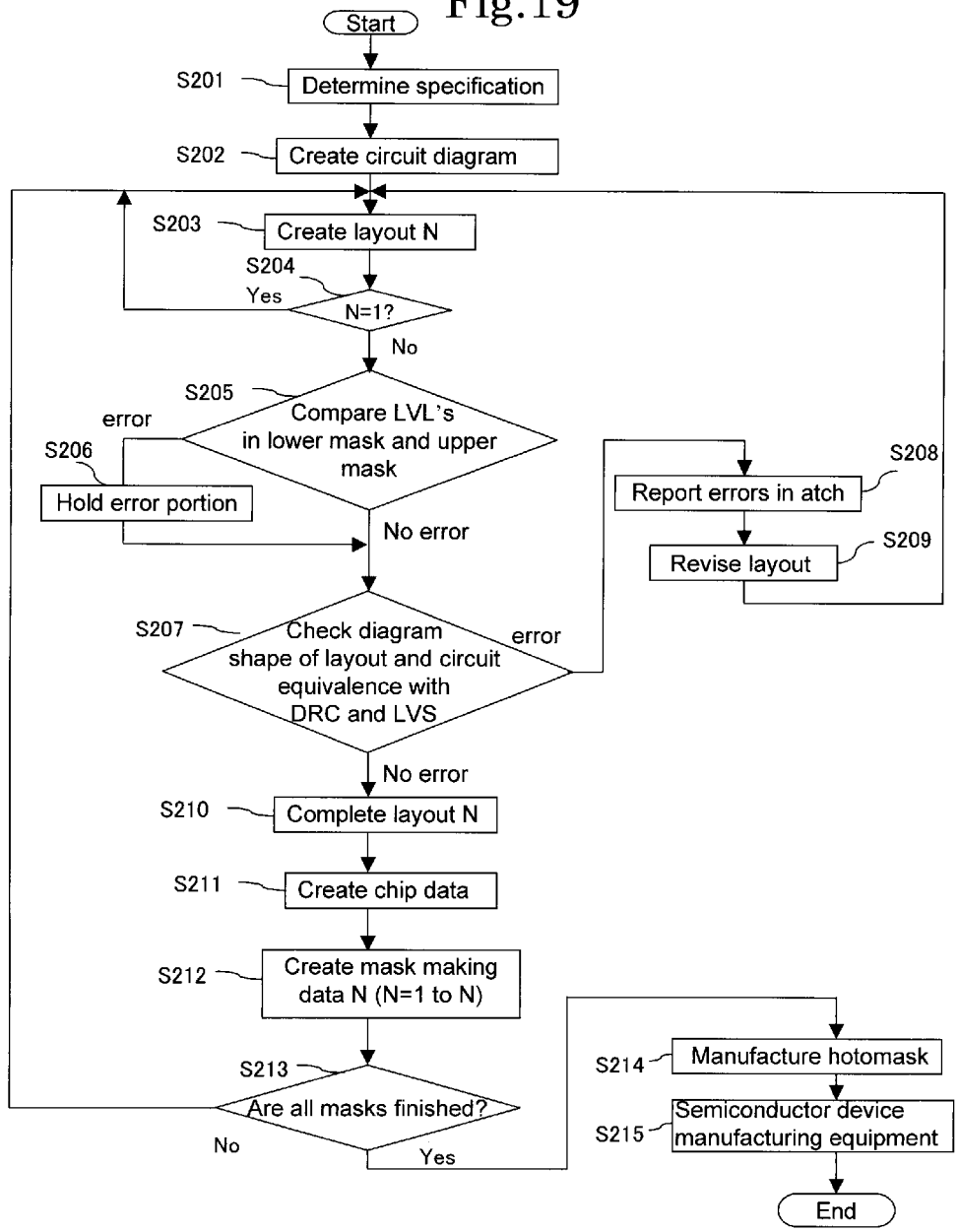
FIG. 19 is a flowchart showing one example of a method of creating layout data of a ninth embodiment in the present invention.

Next, the layout data creation processing executed in the layout data making equipment 20 of the ninth embodiment is described with reference to the flowchart shown in FIG. 19 and one example of the layout shown in FIG. 15 and FIG. 16.

In the first place, the specification on a semiconductor integrated device is determined, based on the specification data on the semiconductor integrated device (step S201), the logic circuit schematic design section 30 creates a circuit diagram, based on the specification (step S202). Next, the layout data creation section 40 creates layout data N (including N=1, 2, 3, - - - , N−1, N) corresponding to each layer in order to create the created circuit diagram as an actual chip data of multilayered structure N (step S203). The layout data creation section 40 outputs the created layout data corresponding to the fist layer to the data input/output section 90. The layout data is outputted to the LVL verification section 110 from the data input/output section 90.

Next, if a layout data 1 is inputted, the LVL verification section 110 holds the layout data and judges whether or not it is the first layer-layout data (N=?) (step S204). If it judges that the layout data is the first layer (step S204: Yes), it outputs the next layer layout data creation command to the data input/output section 90. The next layer layout data creation command is outputted to the layout data creation section 40 from the data input/output section 90. Therefore, the processing of the above step S203 is iteratively executed to execute the creation processing of the second layer-layout data.

Next, if a layout data is inputted from the mask making data creation section 100, the LVL verification section 110 holds the layout data and judges whether or not it is the first layer-layout data (step 204). It judges that the layout data is not the first layer (step S204: No) and advances to step S205.

In step S205, the LVL verification section 110 executes LVL comparison processing of the held first layer-layout data (lower layer-layout) and the second layer-layout data (upper layer-layout). In the LVL comparison processing, a difference between the first layer-layout data and the second layer-layout data is outputted, and whether or not the position of the layout data is moved is verified to judge the existence or nonexistence of error portions. If the LVL verification section 110 judges that there are some error portions, the error portions are held (step S206), it outputs the first layer-layout data and the second layer-layout data after the LVL comparison processing is finished to the data input/output section 90.

In addition, if the LVL verification section 110 judges that there are not any error portions, the first layer-layout data and the second layer-layout data after the LVL comparison processing is finished are outputted to the data input/output section 90. These first layer-layout data and second layer-layout data are outputted to the layout data creation section 40 from the data input/output section 90. Further, the first layer-layout data and second layer-layout data inputted in the layout data creation section 40 are outputted to the layout data verification section 70 and the logic connection verification section 60, and layout verification processing by DRC and LVS is executed thereon in step S207.

Next, in step S207, the layout data verification section 70 first extracts the graphics related to devices and lines from the first layer-layout data shown in FIG. 15, DRC is executed by selecting one or a plurality of design rules on each graphics to judge the existence or nonexistence of error portions. In addition, in step S207, the logic connection verification 60 executes LVS to restore the connection data on the gate level from the first layer-layout data shown in FIG. 15 and further convert the connection data on the gate level into the connection data on the transistor level. The logic connection verification section 60 collates and confirms whether or not the connection data on the transistor level matches the data on the logic circuit diagram, further whether or not the data on the potentials inputted in the nodes of the devices and the nodes of the connections between the devices match the data on the logic circuit diagram to judge the existence or nonexistence of error portions. Subsequently, DRC and LVS are executed on even the second layer-layout data likewise to verify the layout.

In step S207, if both the layout data verification section 70 and the logic connection verification section 60 or any of them judges that there are some errors, an error portion report output command together with the error portion report is outputted to the layout data creation section 40. The error portion report output command is outputted to the LVL verification section 110 through the data input/output section 90 from the layout data creation section 40. The LVL verification section 110 outputs the previously held error portion report to the data input/output section 90 if the error portion report output command is inputted. The error portion report is outputted to the layout data creation section 40 through the data input/output section 90. Therefore, in the ninth embodiment, the error portions judged in the LVL verification section 110 and the error portions judged in the layout data verification section 70 and the logic connection verification section 60 are outputted in batch as the error portion report to the layout data creation section 40 (step S208).

Next, the layout data creation section 40 confirms the error portion report to revise the layout data (step S209). Thereafter, the processings of step S203 to step S209 are iteratively executed until error portions are not left. In this case, the layout data creation section 40 confirms the error report to revise the first layer-layout data (step S206). Therefore, if it is judged that there are error portions in the layout data in the lower layer by the LVL comparison processing, it is possible to revise the layout data so as to allow the relative position to be fitted with that of the layout data in the upper layer. Namely, it is possible to revise the position of the diffusion layer 12 in the first layer-layout data shown in FIG. 16 so as to match the positions of the wiring layer A13, the wiring layer B14, and the contact layer 15 in the second layer-layout data.

In addition, in step S207, if both the layout data verification section 70 and the logic connection verification 60 judge that there are not any errors, the creation of the first layer-layout data and the second layer-layout data is completed (step S210), and the creation of the first layer-chip data and the second layer-chip data is completed (step S211). Next, the layout data creation section 40 outputs the first layer-chip data and the second layer-chip data to the data input/output section 90. These first layer-chip data and second layer-chip data are outputted to the mask making data creation section 100 from the data input/output section 90.

Next, the mask making data creation section 100 creates the mask making data 1 in the first layer and the mask making data in the second layer, based on the first layer-chip data and the second layer-chip data (step S212). Next, the mask making data creation section 100 judges whether or not the creation of the mask making data of all the layers is finished (step S213). If it judges that the creation of the mask making data of all the layers is not finished (step S213: No), it outputs the next layer-layout data creation command to the data input/output section 90. The next layer-layout data creation command is outputted to the layout data creation section 40 from the data input/output section 90. In this case, the processings of step S203 to step S212 are executed again. In addition, the mask making data creation section 100 outputs all the mask making data N to the photomask manufacturing equipment 120 if the creation of all the mask making data is finished (step S213: Yes). Therefore, it is possible to execute the layout verification processing by applying DRC and LVS to the layout data on which the layout verification is performed after layout verification processing is executed by applying LVL to the layout data of adjacent layers, by iteratively executing the processings of the above step S203 to step S212. In addition, the layout data on the upper layer side is out of the two layout data on which LVL comparison processing is performed is held, thereby enabling the system to perform LVL comparison processing on the layout data and a layout data of a further upper layers that are created next, before LVL comparison processing performed on layout data of all the layers is finished in the LVL verification section 110.

Because each processing of step S214 and step S215 is the same one as described in the above seventh embedment, the description thereof is omitted.

As is described in the foregoing, according to the ninth embodiment in the present invention, after layout verification processing by LVL is executed on the layout data of adjacent layers to judge the existence or nonexistence of error portions of the layout data in the lower layer, layout verification processing by DRC and LVL is executed on the layout data of each layer to judge the existence or nonexistence of error portions, thereby enabling the system to output an error portion report in batch and revise the layout data again.

Therefore, in manufacturing a multilayered structure semiconductor device, the layout verification processing by LVL can be applied to the layout data of adjacent layers, besides the layout verification processing by DRC and LVS applied to a layout data of each layer. This application allows accuracy in layout verification processing to be improved, thereby enabling the system to further improve the quality of a layout design data.

In addition, according to the ninth embodiment in the present invention, it is possible to reduce the man-hour to revise the errors of the layout data, because it is designed to output error portions judged by layout verification processing using LVL and error portions judged by layout verification processing using DRC and LVS in batch as an error portion report.

Tenth Embodiment

In the tenth embodiment, in manufacturing a multilayered structure semiconductor device, layout verification processing by DRC and LVS is executed on the layout data created by layer and layout verification processing by LVL is executed on the layout data of two adjacent layers out of the layout data by layer after layout verification is performed.

Because the composition of the layout making equipment of the tenth embodiment is the same one as shown in FIG. 17 above, the illustration and the description of the composition are omitted.

Figure 20:
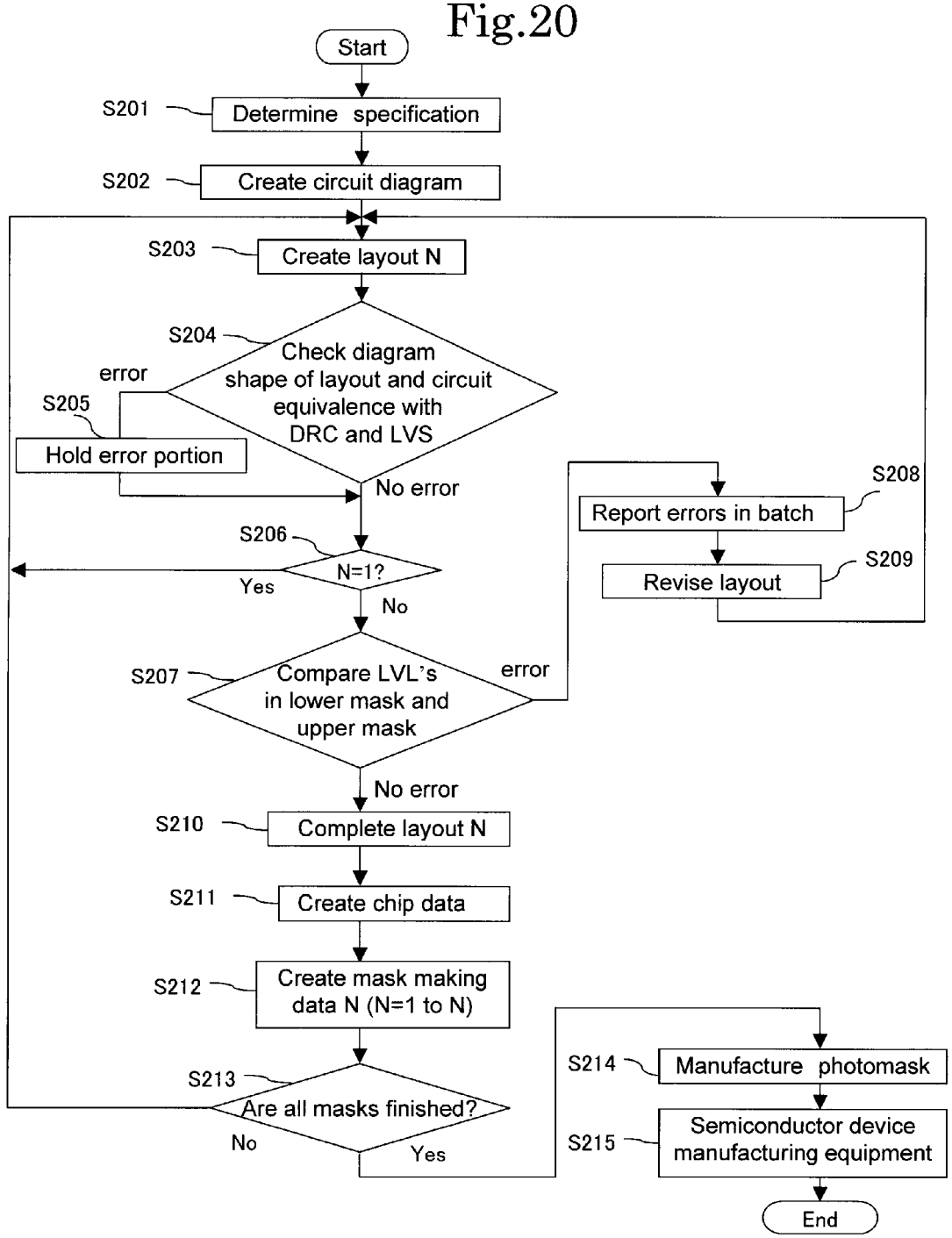
FIG. 20 is a flowchart showing one example of a method of creating layout data of a tenth embodiment in the present invention.

Next, the layout data creation processing executed in the layout making equipment of the tenth embodiment is described with reference to the flowchart shown in FIG. 20 and one example of the layouts shown in FIG. 15 and FIG. 16.

In the first place, the specification on a semiconductor integrated circuit is determined, based on the specification data on the semiconductor integrated circuit (step S201), the logic circuit schematic design section 30 creates a circuit diagram, based on the specification (step S202). Next, the layout data creation section 40 creates a layout data N (including N=1, 2, 3, - - -, N−1 N) corresponding to each layer in order to create the created circuit diagram as an actual chip data of multilayered structure N.

Next, in step S204, the layout data verification section 70 first extracts graphics related to devices and lines from the first layer-layout data shown in FIG. 15 and executes DRC by selecting one or a plurality of design rules to each graphics to judge the existence or nonexistence of error portions. In addition, in step S204, the logic connection verification section 60 executes LVS to restore the connection data on the gate level from the layout data of the first layer shown in FIG. 15 and further convert the connection data on the transistor level into the data on the logic circuit diagram, and collates and confirms whether or not the connection data on the transistor level matches the data on the logic circuit diagram, further whether or not the data of the potentials inputted in the nodes of the devices and the nodes of the connections between the devices match the data on the logic circuit diagram to judge the existence or nonexistence of error portions.

In step S204, if both the layout data verification section 70 and the logic connection verification section 60 or any of them judges that there are errors, both the layout data verification section 70 and the logic connection verification section 60 or any of them holds the error portions (step S205). In addition, if the layout data verification section 70 and the logic connection verification section 60 judge that there are not any errors, the step advances to step S206. The first layer-layout data after layout verification is over in step S205 is outputted to the data input/output section 90. The first layer-layout data is outputted to the LVL verification section 110 from the data input/output section 90.

Next, in step S206, the LVL verification section 110 judges whether or not the inputted layout data is the first layer-layout data (N=1?). If it judges that the layout data is the first layer (step S206: Yes), the next layer-layout data creation command is outputted to the data input/output section 90. The data input/output section 90 outputs the next layer-layout data creation command to the layout data creation section 40. Thereafter, the processings of the above step S203 to step S205 are iteratively executed to execute the creation processing of the second layer-layout data and check processing of DRC and LVS of the second layer-layout data.

Next, if the second layer-layout data is inputted from the mask making data creation section 100, the LVL verification section 110 holds the layout data and judges whether or not it is the first layer (step S206). It judges that the layout data is not the first layer (step S206: No) and advances to step S207.

In step S207, the LVL verification section 110 executes LVL comparison processing of the held first layer-layout data (lower layer-layout) and second layer-layout data (upper layer-layout). In the LVL comparison processing, a difference between the first layer-layout data and the second layer-layout data is outputted, whether or not the position of the first layer-layout data is moved from the difference is verified to judge the existence or nonexistence of error portions. If the LVL verification section 110 judges that there are errors, an error portion report output command together with the error portion report is outputted to the data input/output section 90. These error portion reports and the error portion report output command are outputted to the layout data creation section 40 from the data input/output section 90. Further, the error portion report output command is outputted to the layout data verification section 70 and the logic connection verification section 60 from the layout data creation section 40. The previously held error portion report is outputted to the layout data creation section 40 from both the layout data verification section 70 and the logic connection verification section 60 or any of them. Therefore, in the tenth embodiment, the error portions judged in the layout data verification section 70 and the logic connection verification section 60 and the error portions judged in the LVL verification section 110 in batch as an error portion report to the layout data creation section 40 (step S208).

Next, the layout data creation section 40 confirms the error portion report and revises the layout data (step S209). Thereafter, the processings of step S203 to step S209 are iteratively executed until error portions are not left. In this case, the layout data creation section 40 confirms the error portion report and revises the first layer-layout data (step S206). Thereafter, the processings of step S203 to step S209 are iteratively executed until error portions are not left. Therefore, if it is judged that there are the error portions in the layout data of the lower layer by LVL comparison processing, it is possible to revise the layout data so as to allow the relative position to be fitted with that of the layout data in the upper layer. Namely, it is possible to revise the position of the diffusion layer 12 of the first layer-layout data shown in FIG. 16 so as to match the positions of the wiring layer A13, the wiring layer B14 and the contact layer 15 of the second layer-layout data.

In addition, in step S207, if the LVL verification section 110 judges that there are not any errors, the creation of the first layer-layout data and the second layer-layout data is completed (step S210), and the creation of the first layer-chip data and the second layer-chip data is completed (step S211). Next, the layout data creation section 40 outputs the first layer-chip data and the second layer-chip data to the data input/output section 90. These first layer-chip data and second layer-chip data are outputted to the mask making data creation section 100 from the data input/output section 90.

Because each processing of step S212 to step S215 are the same ones as described in the above seventh and the ninth embodiments, the descriptions thereof are omitted.

As is described in the foregoing, according to the tenth embodiment in the present invention, after layout verification processing is executed on the layout data of each layer by DRC and LVS to judge the existence or nonexistence of error portions, layout verification processing is executed on the layout data of adjacent layers out of the layout data after the layout verification is over by LVL to judge the existence or nonexistence of error portions in the layout data of the lower layer, thereby enabling the system to output the error portion reports in batch and revise the layout data again.

Therefore, in manufacturing a multilayered structure semiconductor device, layout verification processing can be applied to the layout data of adjacent layers by LVL, besides layout verification processing that can be applied to the layout data of each layer by DRC and LVS. This application allows accuracy in layout verification processing to be improved, thereby enabling the system to further improve the quality of a layout design data.

In addition, according to the tenth embodiment in the present invention, it is possible to reduce the man-hour to revise the errors of the layout data, because it is designed to output error portions judged by layout verification processing using LVL and error portions judged by layout verification processing using DRC and LVS in batch as an error portion report.

Eleventh Embodiment

In the eleventh embodiment, in manufacturing a multilayered structure semiconductor device, layout verification processing is executed on the layout data by layer by DRC and LVS and layout verification processing is executed on the layout data of two adjacent layers by LVL in parallel.

Because the composition of the layout making equipment of the eleventh embodiment is the same one as shown in FIG. 17 above, the illustration and the description of the composition are omitted.

Figure 21:
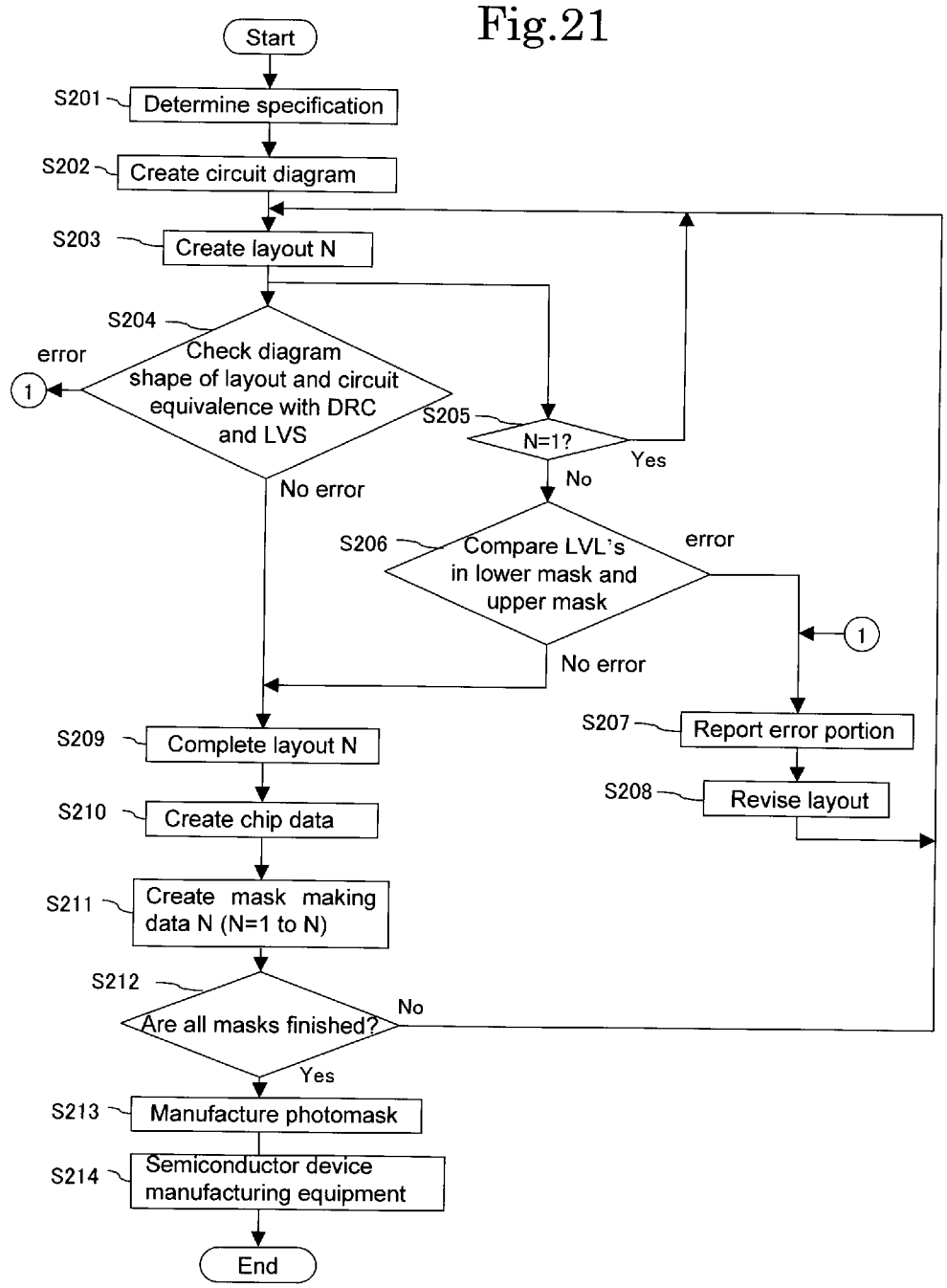
FIG. 21 is a flowchart showing one example of a method of creating layout data of an eleventh embodiment in the present invention.

Next, the layout data creation processing executed in the layout data making equipment 20 of the eleventh embodiment is described with reference to one example of the layouts shown in the flowchart in FIG. 21 and one example in FIG. 15 and FIG. 16.

In the first place, the specification of the semiconductor integrated circuit is determined, based on the specification data of the semiconductor integrated circuit (step S201). The logic circuit schematic design section 30 creates a circuit diagram, based on the specification (step S202). Next, the layout data creation section 40 creates a layout data N (including N=1, 2, 3, - - -, N-1, N) corresponding to each layer in order to create the created circuit diagram as an actual chip data of multilayered structure N (step S203). The first layer-layout data created in the layout data creation section 40 is outputted to the data input/output section 90. The first layer-layout data is outputted to the LVL verification section 100 from the data input/output section 90.

Next, in step S204, the layout data verification section 70 first extracts graphics related to devices and lines from the first layer-layout data shown in FIG. 15 and executes DRC by selects a part of design rules to each graphics to judge the existence or nonexistence of error portions. In addition, in step S204, the logic connection verification section 60 executes LVS to restore the connection data on the gate level from the first layer-layout data shown in FIG. 15 and further convert the connection data on the gate level into the connection data on the transistor level and further collates and confirms whether or not the data on the potentials inputted in the nodes of the device and the nodes of the connections between the devices match the data on the logic circuit diagram to judge the existence or nonexistence of error portions.

In step S204, if both layout data verification section 70 and the logic connection verification section 60 or any of them judges that there are errors, both layout data verification section 70 and the logic connection verification section 60 or any of them outputs an error portion report to the layout data creation section 40 (step S207).

In addition, the processing in step S204 and the processing in step S205 are executed in parallel. In step S205, if a first layer-layout data is inputted, the LVL verification section 110 holds the layout data to judge whether or not the layout data is the first layer (N=1?) (step S205). If it judges that the layout data is the first layer (step S205: Yes), it outputs the next layout data creation command to the data input/output section 90. The next layout data creation command is outputted to the layout data creation section 40 from the data input/output section 90. The layout data creation section 40 executes the processing in the above step S203 to create a second layer-layout and outputs the created second layer-layout data to the data input/output section 90. The second layer-layout is outputted to the LVL verification section 110.

Next, if the second layer-layout data is inputted, the LVL verification section 110 holds the layout data to judge whether or not it is the first layer-layout data (step S205). It judges that the layout data is not the first layer (step S205: No) and advances to step S206.

In step S206, the LVL verification section 110 executes LVL comparison processing of the held first layer-layout data (lower layer-layout) and second layer-layout data (upper layer-layout). In the LVL verification processing, a difference between the first layer-layout data and the second layer-layout data is outputted, whether or not the position of the first layer-layout data is not moved is verified to judge the existence or nonexistence of error portions. If the LVL verification section 110 judges that there are errors, it outputs an error portion report to the data input/output section 90 (step S207). The error portion report is outputted to the layout data creation section 40 from the data input/output section 90.

Next, the layout data creation section 40 confirms the error portion report inputted from both layout data verification section 70 and the logic connection verification section 60 or any of them and the error portion report inputted from the LVL verification section 110 to revise the layout data (step S208). Thereafter, the processings of step S203 to step S208 are iteratively executed until error portions are not left. In this case, the layout data creation section 40 confirms the error portion report to revise the first layer-layout data and the second layer-layout data (step S208). Therefore, if it is judged that there are error portions in the layout data of the lower layer by the LVL comparison processing, it is possible revise the layout data so as to allow the relative position to be fitted with that of the layout data in the upper layer. Namely, it is possible to revise the position of the diffusion layer 12 of the first layer-layout data shown in FIG. 16 so as to match the positions of the wiring layer A13, the wiring layer B14, and the contact layer 15 of the second layer-layout data.

In addition, in step S204, if both the layout data verification section 70 and the logic connection verification section 60 judge that there are not any errors, and if the LVL verification section 110 judges that there are not any errors, the creation of the first layer and the second layer-layout data is completed (step S210), and the creation of the first and the second layer-chip data is completed (step S211).

Because each processing of the subsequent step S204 to step S214 are the same ones as described in the above eight embodiment, the descriptions thereof are omitted.

As is described in the foregoing, according to the eleventh embodiment in the present invention, after layout verification processing is executed on the layout data of each layer by DRC and LVS and layout verification processing is executed on layout data of adjacent layers by LVL in parallel to judge the existence or nonexistence of error portions, it is possible to each output the error portion report and revise the layout data again.

Therefore, in manufacturing a multilayered structure semiconductor device, layout verification processing can be applied to the layout data of adjacent layers by LVL, besides layout verification processing that can be applied to the layout data of each layer by DRC and LVS. This application allows accuracy in layout verification processing to be improved, thereby enabling the system to further improve the quality of a layout design data.

In addition, according to the eleventh embodiment in the present invention, because it is designed to execute layout verification processing by DRC and LVS and layout verification processing by LVL in parallel, it is possible to reduce the man-hour to revise errors of the layout data.

In addition, in the seventh to the eleventh embodiments above, there are shown a case where layout verification processing is executed on layout data by layer by DRC and LVS and layout verification processing is executed on the layout data by layer or mask making data by layer using LVL and the procedures of these layout verification processings are changed, and a case where the error portion reports are outputted in batch. The layout making equipment of the embodiments in the present invention are not limited to these processing procedures only, and for example, a processing may be executed by dividing the layout verification processing to apply DRC where a part of design rule is each selected to the polysilicon layer and the diffusion layer included in the first layer-layout shown in FIG. 15. A layer to which layout verification processing using LVL is applied may be divided to cope with layout verification processing to which DRC where such a part of the design rule is selected is applied. Namely, for the layout making equipment of the embodiments in the present invention, the processing procedures of layout verification processing using DRC and LVS and layout verification processing using LVL may be suitably changed in accordance with the structural features of a multilayered structure semiconductor device that is an object on which a layout verification processing is performed.

I claim:

1. A layout making equipment of a semiconductor integrated circuit, comprising:
    a logic circuit schematic design section that designs a logic circuit diagram, based on specification data on the semiconductor integrated circuit;
    a layout data creation section that creates layout data having devices and connections between the devices, based on the logic circuit diagram;
    a logic connection verification section that extracts data about the devices and the connections between the devices from the created layout data, verifies whether or not data in the logic circuit diagram matches the data about the devices and the connections between the devices, further extracts data of potentials inputted in nodes of the devices and nodes of the connections between the devices, based on the data in the logic circuit diagram, and collates and confirms whether or not the data of the potentials matches the data in the logic circuit diagram, thereby to create collation results;
    a layout data verification section that verifies whether or not the created layout data violates a design rule extracted from the specification data on the semiconductor integrated circuit, based on the data about the devices and the connections between the devices and the data of the potentials inputted in the nodes of the devices and the nodes of the connections between the devices extracted in the logic connection verification section, thereby to create verification results; and
    a data output section that outputs the layout data created by the layout data creation section.

2. The layout making equipment of a semiconductor integrated circuit according to claim 1 wherein, the logic connection verification section and the layout data verification section execute verifications on an entire scope of the semiconductor integrated circuit or a designated scope that is limited in the semiconductor integrated circuit.

3. The layout making equipment of a semiconductor integrated circuit according to claim 1 wherein, the logic connection verification section arbitrarily selects data on two or more devices and connections between the two or more devices from the data about the devices and the connections between the devices and executes verification thereon.

4. The layout making equipment of a semiconductor integrated circuit according to claim 1 wherein, the layout data verification section arbitrarily selects one or a plurality of design rules and executes verification thereon.

5. The layout making equipment of a semiconductor integrated circuit according to claim 1, wherein the layout data verification section verifies whether or not the created layout data violates the design rule extracted from the specification data on the semiconductor integrated circuit, based on the data about the devices and the connections between the devices recognized in the logic connection verification section.

6. The layout making equipment of a semiconductor integrated circuit according to claim 1, wherein
    the layout data creation section creates layout data of a multilayered semiconductor integrated circuit by layer, based on the logic circuit diagram;
    the logic connection verification section extracts the data about the devices and the connections between the devices from the created layout data by layer, verifies whether or not the data in the logic circuit diagram matches the data about the devices and the connections between the devices, further extracts the data of the potentials inputted in nodes of the devices and nodes of the connections between the devices, based on the data in the logic circuit diagram, and collates and confirms whether or not the data of the potentials matches the data in the logic circuit diagram, thereby to create the collation results;
    the layout data verification section verifies whether or not the created layout data by layer violates the design rule extracted from the specification data on the multilayered semiconductor integrated circuit, based on the data about the devices and the connections between the devices and the data of the potentials inputted in the nodes of the devices and the nodes of the connections between the devices extracted in the logic connection verification section, thereby to create a set of verification results on layout data; and the layout making equipment further comprising:
    an interlayer layout verification section that compares positions of the devices with connection positions between the devices between layout data of different layers among a plurality of layers by layer, and verifies position deviations between the positions of the devices and the connection positions between the devices, thereby to create a set of verification results on an interlayer layout.

7. The layout making equipment of a semiconductor integrated circuit according to claim 6, wherein the interlayer layout verification section compares the positions of the devices in layout data between adjacent different layers with the connection positions between the devices among a plurality of the layout data by layer, and verifies position deviations between the positions of the devices and the connection positions between the devices, thereby to create the set of verification results on the interlayer layout.

8. The layout making equipment of a semiconductor integrated circuit according to claim 6, wherein the interlayer layout verification section compares the positions of the devices and connection positions between the devices between mask making data of different layers among a plurality of mask making data created from a plurality of the layout data by layer and verifies position deviations between the positions of the devices and the connection positions between the devices, thereby to create the set of verification results on the interlayer layout.

9. The layout making equipment of a semiconductor integrated circuit according to claim 6, wherein the collation results created by the logic connection verification section and each set of the verification results created by the layout data verification section and the interlayer verification section are outputted in batch to the layout data creation section.

10. A method of making a layout of a semiconductor integrated circuit using a layout making equipment, comprising:
    designing a logic circuit diagram, based on specification data on the semiconductor integrated circuit;
    creating, by the layout making equipment, layout data having devices and connections between the devices, based on the designed logic circuit diagram;
    extracting data about the devices and the connections between the devices from the created layout data, verifying whether or not data in the logic circuit diagram matches the data about the devices and the connections between the devices, further extracting data of potentials inputted in nodes of the devices and nodes of the connections between the devices, based on the data in the logic circuit diagram, and collating and confirming whether or not the data of the potentials matches the data in the logic circuit diagram, thereby to create collation results;
    verifying, by the layout making equipment, whether or not the created layout data violates a design rule extracted from the specification data on the semiconductor integrated circuit, based on the data about the devices and the connections between the devices and the data of the potentials inputted in the nodes of the devices and the nodes of the connections between the devices, thereby to create verification results; and
    outputting the created layout data.

11. The method of making a layout of a semiconductor integrated circuit according to claim 10, wherein verifying a logic connection and verifying the layout data are executed on an entire scope of the semiconductor integrated circuit or a designated scope that is limited in the semiconductor integrated circuit.

12. The method of making a layout of a semiconductor integrated circuit according to claim 10, wherein verifying a logic connection is executed by arbitrarily selecting data on two or more devices and connections between the two or more devices from the data about the devices and the connections between the devices.

13. The method of making a layout of a semiconductor integrated circuit according to claim 10, wherein verifying the layout data is executed by arbitrarily selecting one or a plurality of design rules.

14. The method of making a layout of a semiconductor integrated circuit according to claim 10, wherein verifying the layout data includes verifying whether or not the created layout data violates a design rule extracted from the specification data on the semiconductor integrated circuit, based on the data about the devices and the connections between the devices recognized in verifying a logic connection.

15. The method of making a layout of a semiconductor integrated circuit according to claim 10, further comprising:
    creating, by the layout making equipment, layout data of a multilayered semiconductor integrated circuit by layer, based on the designed logic circuit diagram;
    extracting the data about the devices and the connections between the devices from the created layout data by layer, verifying whether or not data in the logic circuit diagram matches the data about the devices and the connections between the devices, further extracting the data of the potentials inputted in nodes of the devices and nodes of the connections between the devices, based on the data in the logic circuit diagram, and collates and confirms collating and confirming whether or not the data of the potentials matches the data in the logic circuit diagram, thereby to create the collation results in verifying the logic connection;
    verifying, by the layout making equipment, whether or not the created layout data by layer violates a design rule extracted from the specification data on the multilayered semiconductor integrated circuit, based on the data about the devices and the connections between the devices and the data of the potentials inputted in the nodes of the devices and the nodes of the connections between the devices, thereby to create a set of verification results on layout data in verifying the layout data; and
    comparing positions of the devices between layout data of different layers with connection positions between the devices among a plurality of the layout data by layer, and verifying position deviations between the positions of the devices and the connection positions between the devices, thereby to create the verification results.

16. The method of making a layout of a semiconductor integrated circuit according to claim 15, wherein comparing the positions of the devices includes comparing the positions of the devices with connection positions between layout data of adjacent different layers among a plurality of the layout data by layer, and verifying the position deviations between the positions of the devices and the connection positions between the devices, thereby to create the verification results in verifying an interlayer layout.

17. The method of making a layout of a semiconductor integrated circuit according to claim 15, wherein comparing the positions of the devices includes comparing the positions of the devices with the connection positions between the devices between mask making data of different layers among a plurality of mask making data created from a plurality of the layout data by layer, and verifying the position deviations between the position of the devices and the connection positions between the devices, thereby to create a set of verification results on interlayer layout in verifying the interlayer layout.

18. The method of making a layout of a semiconductor integrated circuit according to claim 15, wherein the collation result created in verifying the logic connection and each set of the verification results created in verifying the layout data and verifying the interlayer layout are outputted in batch.

19. The method of making a layout of a semiconductor integrated circuit according to claim 15, wherein verifying the logic connection, verifying the layout data, and verifying the interlayer are executed in parallel.

20. A process of manufacture of a semiconductor integrated circuit, comprising:

designing a logic circuit diagram, based on specification data on the semiconductor integrated circuit;

creating layout data having devices and connections between the devices, based on the logic circuit diagram;

extracting data about the devices and the connections between the devices from the created layout data, verifying whether or not data in the logic circuit diagram matches the data about the devices and the connections between the devices, further extracting data of potentials inputted in nodes of the devices and nodes of the connections between the devices, based on the data in the logic circuit diagram, and confirms collating and confirming whether or not the data of the potentials match the data in the logic circuit diagram, thereby to create collation results;

verifying whether or not the created layout data violates a design rule extracted from the specification data on the semiconductor integrated circuit, based on the data about the devices and the connections between the devices and the data of the potentials inputted in the nodes of the devices and the nodes of the connections between the devices, thereby to create verification results;

outputting the created layout data;

manufacturing, using a photomask manufacturing equipment, a photomask having a mask pattern, based on the layout data; and exposing a photosensitive resin thin film formed on a semiconductor substrate using the photomask.

* * * * *